United States Patent
Kim et al.

(10) Patent No.: US 12,380,952 B2
(45) Date of Patent: Aug. 5, 2025

(54) MEMORY DEVICE INCLUDING PASS TRANSISTOR CIRCUIT

(71) Applicant: SAMSUNG ELECTRONICS CO., LTD., Suwon-si (KR)

(72) Inventors: Seungyeon Kim, Seoul (KR); Daeseok Byeon, Seongnam-si (KR); Pansuk Kwak, Goyang-si (KR); Hongsoo Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/529,897

(22) Filed: Dec. 5, 2023

(65) Prior Publication Data

US 2024/0105268 A1    Mar. 28, 2024

Related U.S. Application Data

(63) Continuation of application No. 18/504,093, filed on Nov. 7, 2023, which is a continuation of application
(Continued)

(30) Foreign Application Priority Data

Oct. 16, 2020 (KR) .................. 10-2020-0134611

(51) Int. Cl.
    *G11C 16/24*    (2006.01)
    *G11C 5/06*    (2006.01)
(Continued)

(52) U.S. Cl.
    CPC ............ *G11C 16/24* (2013.01); *G11C 5/06* (2013.01); *G11C 16/26* (2013.01); *H10B 41/27* (2023.02); *H10B 43/27* (2023.02)

(58) Field of Classification Search
None
See application file for complete search history.

(56) References Cited

U.S. PATENT DOCUMENTS 5,654,925 A    8/1997    Koh et al.
8,593,865 B2    11/2013    Kim et al.
(Continued)

FOREIGN PATENT DOCUMENTS

KR      10-1636015 B1    7/2016
KR    10-2017-0047843    5/2017
(Continued)

OTHER PUBLICATIONS

Extended European Search Report in European Appln. No. 21186666.0, mailed on Jan. 14, 2022, 8 pages.
(Continued)

*Primary Examiner* — Viet Q Nguyen
(74) *Attorney, Agent, or Firm* — Fish & Richardson P.C.

(57) ABSTRACT

A memory device includes: a memory cell array including a first memory block and a second memory block adjacently disposed in a first direction, driving signal lines respectively corresponding to vertically stacked word lines, and a pass transistor circuit including an odd number of pass transistor groups and connected between the driving signal lines and the memory cell array. One of the odd number of pass transistor groups includes a first pass transistor connected between a first word line of the first memory block and a first driving signal line among the driving signal lines, and a second pass transistor connected between a first word line of the second memory block and the first driving signal line adjacently disposed to the first pass transistor in a second direction.

29 Claims, 26 Drawing Sheets

Related U.S. Application Data

No. 17/898,885, filed on Aug. 30, 2022, now Pat. No. 11,837,293, which is a continuation of application No. 17/227,501, filed on Apr. 12, 2021, now Pat. No. 11,462,275.

(51) Int. Cl.
*G11C 16/26* (2006.01)
*H10B 41/27* (2023.01)
*H10B 43/27* (2023.01)

(56) References Cited

U.S. PATENT DOCUMENTS

| | | | |
|---|---|---|---|
| 8,982,639 B2* | 3/2015 | Kim | H10B 43/20 |
| | | | 365/185.23 |
| 9,142,297 B2* | 9/2015 | Kim | G11C 16/0483 |
| 9,437,300 B2 | 9/2016 | Kamata et al. | |
| 9,576,612 B2 | 2/2017 | Park et al. | |
| 9,595,331 B1 | 3/2017 | Lee et al. | |
| 9,837,419 B2 | 12/2017 | Oh et al. | |
| 10,319,738 B2 | 6/2019 | Kim et al. | |
| 10,388,663 B2 | 8/2019 | Oh et al. | |
| 10,615,173 B2 | 4/2020 | Kim et al. | |
| 10,640,807 B2* | 5/2020 | Pollak | C12Q 1/68 |
| 11,189,634 B2* | 11/2021 | Yun | H01L 23/53266 |
| 11,315,895 B2* | 4/2022 | Oh | G11C 16/08 |
| 11,355,194 B2* | 6/2022 | Yun | H10B 43/40 |
| 11,462,275 B2* | 10/2022 | Kim | H10B 43/40 |
| 11,823,888 B2 | 11/2023 | Lee et al. | |
| 11,837,293 B2* | 12/2023 | Kim | G11C 16/08 |
| 11,875,855 B2* | 1/2024 | Yun | H10B 43/35 |
| 12,131,784 B2* | 10/2024 | Park | G11C 16/16 |
| 2011/0194366 A1 | 8/2011 | Kwon | |
| 2019/0115361 A1 | 4/2019 | Kim et al. | |
| 2019/0123058 A1 | 4/2019 | Tanzawa | |
| 2019/0238134 A1* | 8/2019 | Lee | H01L 23/49811 |
| 2020/0066744 A1 | 2/2020 | Yun et al. | |
| 2020/0388336 A1 | 12/2020 | Yun et al. | |
| 2021/0202457 A1 | 7/2021 | Choi et al. | |
| 2022/0130849 A1* | 4/2022 | Kwon | H10B 41/41 |
| 2022/0406385 A1* | 12/2022 | Kim | G11C 16/26 |
| 2023/0080436 A1 | 3/2023 | Yu et al. | |
| 2023/0162791 A1 | 5/2023 | Jeon et al. | |

FOREIGN PATENT DOCUMENTS

| | | |
|---|---|---|
| KR | 10-2018-0113227 | 10/2018 |
| KR | 10-2019-0042387 A | 4/2019 |
| KR | 10-2020-0021779 A | 3/2020 |

OTHER PUBLICATIONS

Office Action in Korean Appln. No. 10-2020-0134611, mailed on Sep. 20, 2024, 17 pages (with English translation).

Notice of Allowance in Korean Appln. No. 10-2020-0134611, mailed on Mar. 17, 2025, 11 pages.

\* cited by examiner

FIG. 6

|  | PROGRAM | READ | ERASE |
|---|---|---|---|
| Sla (WLsel) | Vpgm (ex. 20V) | Vr (ex. 0V) | Ver (ex. 0V) |
| Slb (WLunsel) | Vpass (ex. 9V) | Vread (ex. 6V) | |

FIG. 8
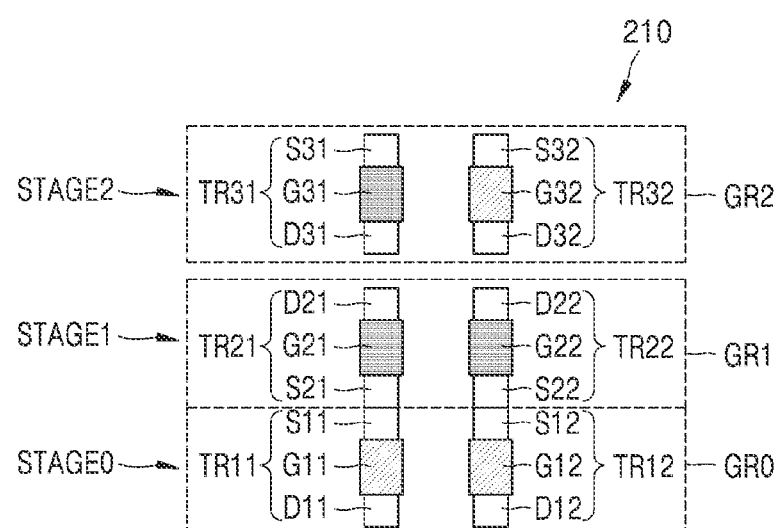
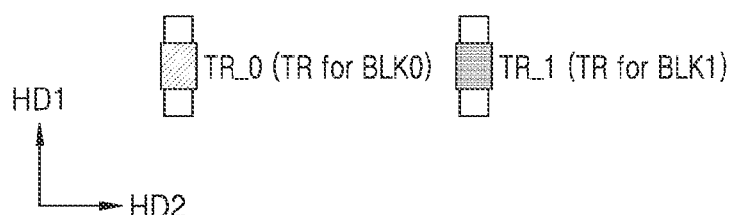

FIG. 10
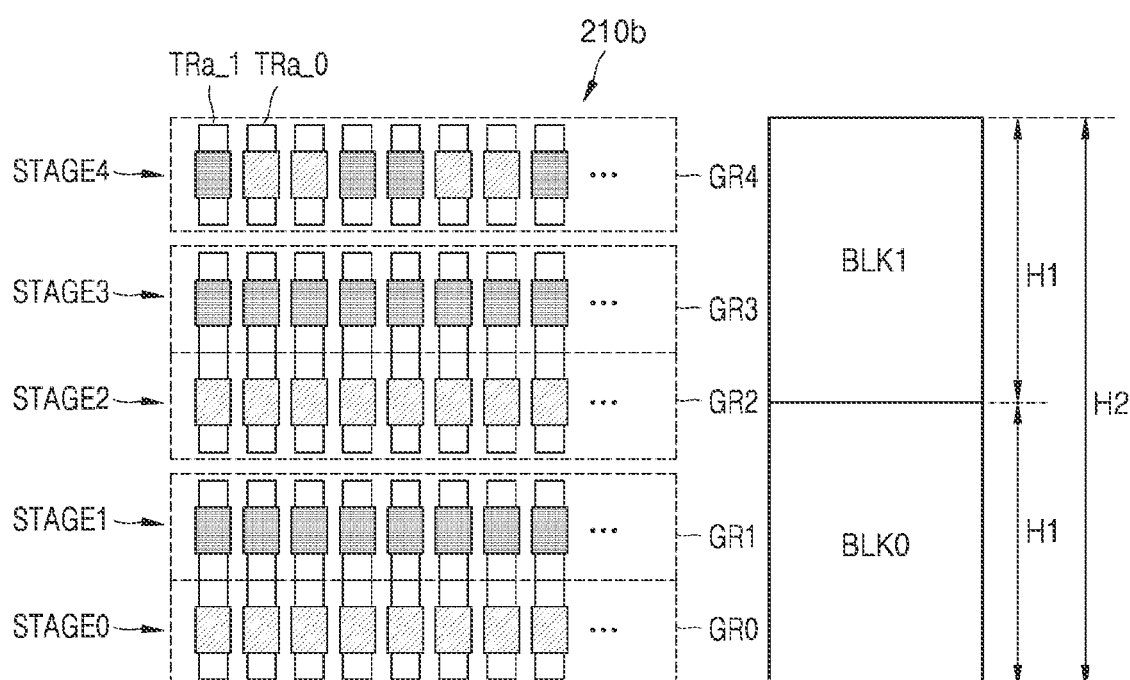
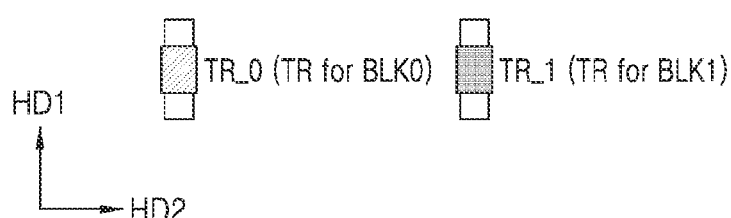

FIG. 17
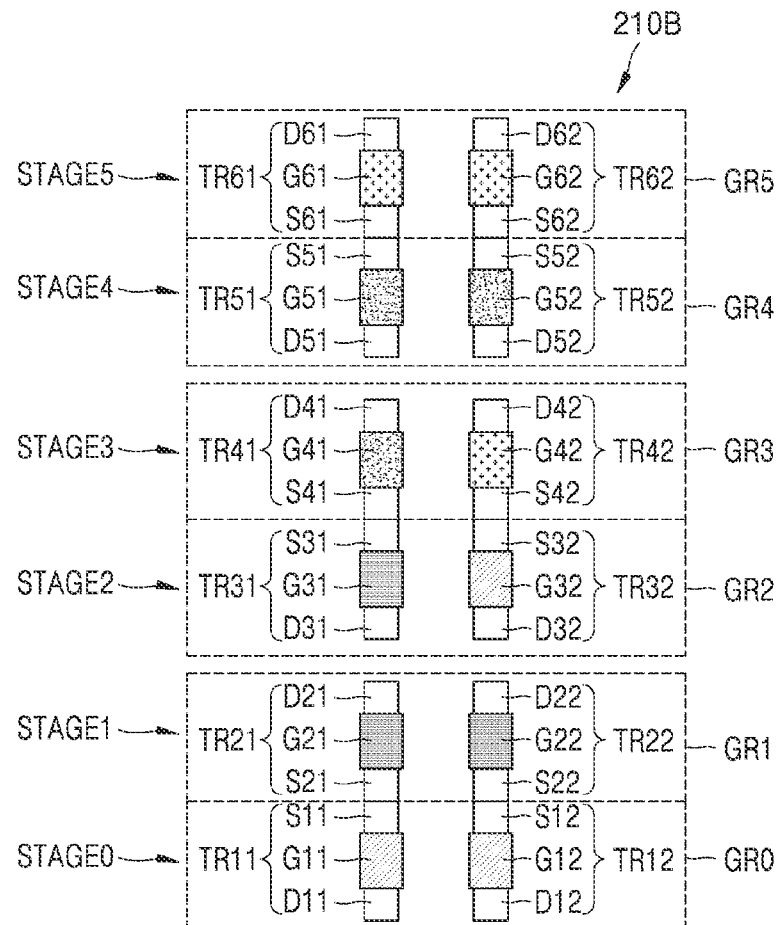
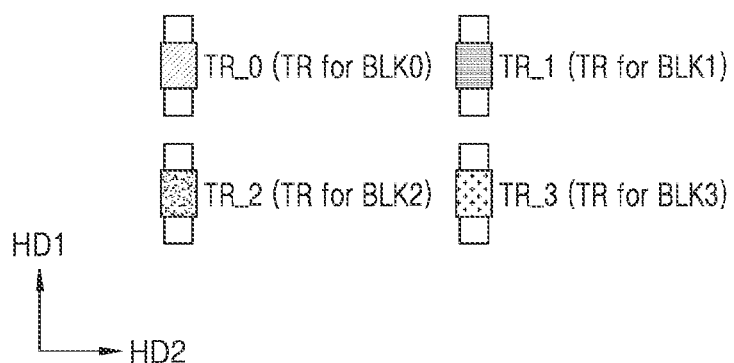

MEMORY DEVICE INCLUDING PASS TRANSISTOR CIRCUIT

CROSS-REFERENCE TO RELATED APPLICATION

This application is a continuation of U.S. application Ser. No. 18/504,093, filed Nov. 7, 2023, which is a continuation of U.S. application Ser. No. 17/898,885, filed Aug. 30, 2022, now U.S. Pat. No. 11,837,293, which is a continuation of U.S. application Ser. No. 17/227,501, filed Apr. 12, 2021, now U.S. Pat. No. 11,462,275, which claims priority under 35 U.S.C. § 119 to Korean Patent Application No. 10-2020-0134611, filed on Oct. 16, 2020, in the Korean Intellectual Property Office, the subject matter of each is hereby incorporated by reference.

BACKGROUND

The inventive concept relates generally to memory devices, and more particularly, to memory devices including a pass transistor circuit.

With continuing expansion of functionality and features provided by contemporary and emerging digital platforms (e.g., smart phones), increasing demands for data storage capacity and high integration density are placed upon memory devices. In response to reductions in the size of memory cells (required for high integration density), the constituent circuits and wiring structures of memory devices have become quite complex. In order to increase the integration density of memory devices, the number of word lines stacked in a vertical direction perpendicular to a principal substrate has increased. As a result, the number of pass transistors connected to word lines has also increased, thereby driving up the overall size of memory array chips.

SUMMARY

One embodiment the inventive concept provides a memory device including: a memory cell array including a first memory block and a second memory block adjacently disposed in a first direction, driving signal lines respectively corresponding to vertically stacked word lines, and a pass transistor circuit including an odd number of pass transistor groups and connected between the driving signal lines and the memory cell array. One of the odd number of pass transistor groups includes; a first pass transistor connected between a first word line of the first memory block and a first driving signal line among the driving signal lines, and a second pass transistor connected between a first word line of the second memory block and the first driving signal line adjacently disposed to the first pass transistor in a second direction.

Another embodiment the inventive concept provides a memory device including; a first semiconductor layer including a first memory block and a second memory block disposed in a first direction, wherein the first memory block includes vertically stacked, first word lines extending in a second direction, and the second memory block includes vertically stacked second word lines extending in the second direction, and a second semiconductor layer including a pass transistor circuit including an odd number of pass transistor groups disposed below the first semiconductor layer. One of the odd number of pass transistor groups includes a first pass transistor connected between a first selection word line corresponding to one of the first word lines, and a first driving signal line, a second pass transistor connected between a second selection word line corresponding to one of the second word lines, and the first driving signal line, and the second pass transistor is adjacently disposed to the first pass transistor in the second direction.

Another embodiment the inventive concept provides a memory device including; a memory cell area including a first metal pad and a first memory block and a second memory block adjacently disposed in a first direction, and a peripheral circuit area including a second metal pad and vertically connected to the memory cell area by the first metal pad and the second metal pad, and further including a pass transistor circuit including a first pass transistor group, a second pass transistor group, and a third pass transistor group adjacently disposed in the first direction. One of the first pass transistor group, the second transistor group and the third pass transistor group includes; a first pass transistor connected to a first word line of the first memory block, and a second pass transistor connected to a second word line of the second memory block and adjacently disposed to the first pass transistor in a second direction, and the first word line of the first memory block and the first word line of the second memory block are disposed at a same level.

BRIEF DESCRIPTION OF THE DRAWINGS

The making and use of the inventive concept may be more clearly understood upon consideration of the following detailed description taken in conjunction with the accompanying drawings in which:

FIG. 6 is a table listing voltage(s) that may be applied to word line(s) (driving signal lines) for each various memory operations;

FIGS. 7, 8, 9 and 10 are respective plan (or top down) views variously illustrating pass transistor circuit(s) according to embodiments of the inventive concept;

FIGS. 12, 13, 14, 15, 16 and 17 are respective plan views variously illustrating pass transistor circuits according to embodiments of the inventive concept;

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Hereinafter, embodiments of the inventive concept will be described in some additional with reference to the accompanying drawings.

Figure 1:
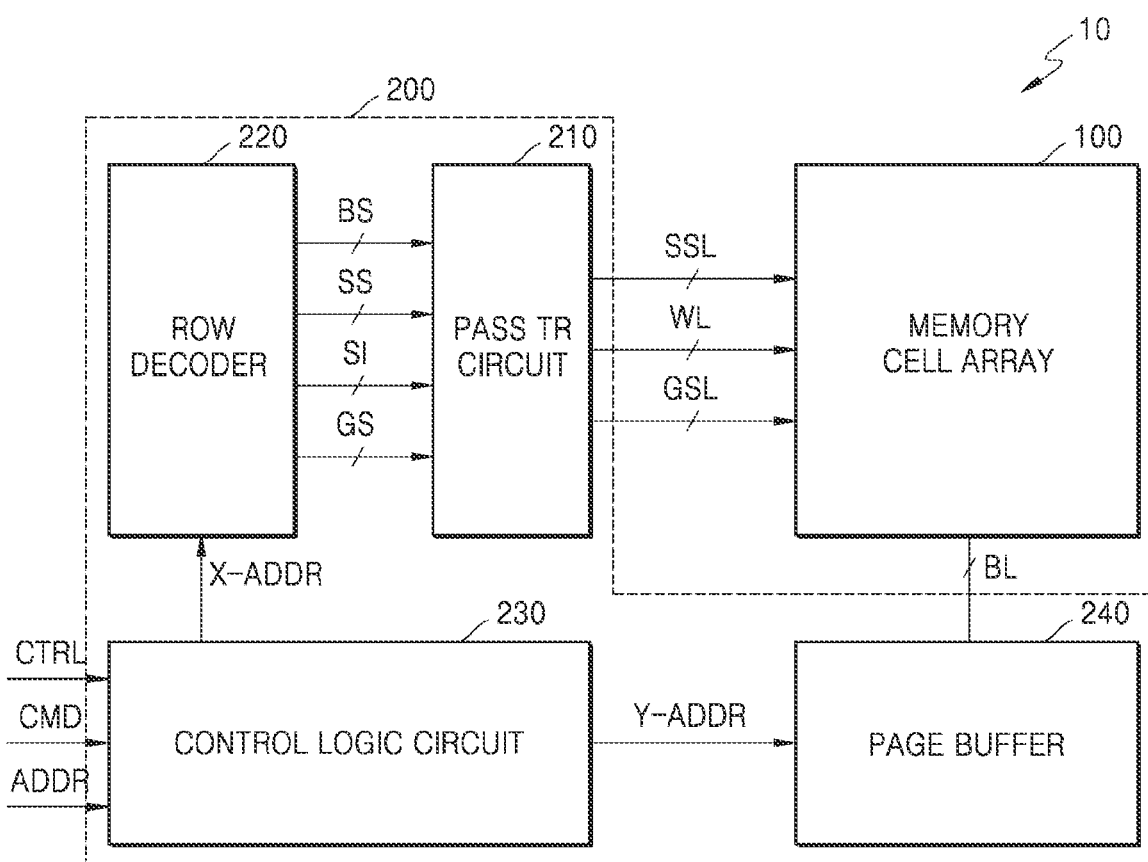
FIG. 1 is a block diagram illustrating a memory device 10 according to embodiments of the inventive concept.

Figure (FIG. 1 is a block diagram illustrating a memory device 10 according to embodiments of the inventive concept.

Referring to FIG. 1, the memory device 10 may generally include a memory cell array 100 and a peripheral circuit 200. Here, the peripheral circuit 200 may include a pass transistor circuit 210, a row decoder 220, a control logic circuit 230, and a page buffer 240. Although not shown, the peripheral circuit 200 may further include a voltage generator, a data input/output (I/O) circuit, an I/O interface, a temperature sensor, a command decoder, or an address decoder. In some embodiments, the memory device 10 may be a nonvolatile memory device.

The memory cell array 100 may be connected to the pass transistor circuit 210 through word lines WL, string selection lines SSL, and ground selection lines GSL and may be connected to the page buffer 240 through bit lines BL. The memory cell array 100 may include memory cells (e.g., flash memory cells). Hereinafter, embodiments of the inventive concept will be described assuming the use (or incorporation of) NAND flash memory cells. However, the inventive concept is not limited thereto. Alternately, the memory cells may be resistive memory cells such as resistive RAM (ReRAM), phase change RAM (PRAM), or magnetic RAM (MRAM).

In some embodiments, the memory cell array 100 may be a three-dimensional (3D) memory cell array including NAND strings, wherein each NAND string includes memory cells connected to vertically stacked word lines. One example of this configuration will be described hereafter in relation to FIG. 3. Further, the collective subject matter of U.S. Pat. Nos. 7,679,133; 8,553,466; 8,654,587; and 8,559,235, as well as U.S. Patent Application No. 2011/0233648 are hereby incorporated by reference.

However, in other embodiments of the inventive concept, the memory cell array 100 may include a two-dimensional (2D) memory cell array including NAND strings arranged in rows and columns.

The control logic circuit 230 may generate various control signals for programming data into the memory cell array 100, reading data from the memory cell array 100, or erasing data stored in the memory cell array 100 based on the command CMD, the address ADDR, and the control signal CTRL. For example, the control logic circuit 230 may output a row address X-ADDR and a column address Y-ADDR. Accordingly, the control logic circuit 230 may generally control various operations within the memory device 10.

The row decoder 220 may output a block selection signal for selecting one of the plurality of memory blocks to the block selection signal lines BS in response to the row address X-ADDR. Also, the row decoder 220 may output a word line driving signal for selecting one of the word lines WL of the selected memory block to the word line driving signal lines SI, output a string selection line driving signal for selecting one of the string selection lines SSL to the string selection line driving signal lines SS, and output a ground selection line driving signal for selecting one of the ground selection lines GSL to the ground selection line driving signal lines GS in response to the row address X-ADDR. The page buffer 240 may select some of the bit lines BL in response to the column address Y-ADDR. Specifically, the page buffer 240 operates as a write driver or sense amplifier according to an operation mode.

The pass transistor circuit 210 may be connected to the row decoder 220 through the block selection signal lines BS, the string selection line driving signal lines SS, the word line driving signal lines SI, and the ground selection line driving signal lines GS. Collectively or singularly, the string selection line driving signal lines SS, the word line driving signal lines SI, and the ground selection line driving signal lines GS may be referred to as "driving signal lines". The pass transistor circuit 210 may include pass transistors (See, e.g., 2111 to 2126 in FIG. 4), wherein the pass transistors may be controlled by block selection signals received through block selection signal lines BS, and may provide string selection line driving signals, word line driving signals, and ground selection line driving signals to the string selection lines SSL, the word lines WL, and the ground selection lines GSL, respectively.

In some embodiments, the pass transistor circuit 210 may include an odd number of pass transistor groups corresponding to two adjacent memory blocks. In this regard, the two memory blocks may be adjacent in a first horizontal direction. The size of the odd number of pass transistor groups in the first direction may be substantially the same as the size of the two memory blocks in the first direction (i.e., a 2-block height). For example, the pass transistor circuit 210 may include three pass transistor groups corresponding to two adjacent memory blocks. However, the inventive concept is not limited thereto, and the pass transistor circuit 210 may include one pass transistor group corresponding to two adjacent memory blocks, or may include five or seven pass transistor groups.

Here, in one of the odd number of pass transistor groups, pass transistors included in different memory blocks and corresponding to word lines disposed at the same level may be adjacently disposed. Accordingly, the lengths of wirings respectively connecting the word lines to the pass transistors may be substantially the same, and the resistances of the wirings may be substantially the same. Accordingly, loading times for word lines included in different memory blocks and disposed at the same level (e.g., word line set up times) may be similarly implemented.

As such, in some embodiments of the inventive concept, pass transistors corresponding to adjacent memory blocks may be arranged in odd rows, and pass transistors included in different memory blocks and connected to word lines disposed at the same level may be disposed adjacent to each other in the second direction. Accordingly, the loading time skew for word lines may be reduced, and overall chip size may also be reduced. Specifically, the length of the wiring between the first word line and the first pass transistor of the first memory block and the length of the wiring between the first word line and the second pass transistor of the second memory block are similarly implemented. Accordingly, variation(s) in path resistance of the first word lines may be reduced, and loading time skew for the first word lines may be reduced.

With continuing development of semiconductor processes, and as the number of stages of memory cells disposed in the memory cell array 100 increases (i.e., as the number of vertically stacked word lines WL increases), the number of pass transistors for driving the word lines WL also increases. Accordingly, an area occupied by the pass transistor circuit 210 may increase. In some embodiments, the peripheral circuit 200 may be vertically disposed above or below the memory cell array 100. That is, the pass transistor circuit 210 may be disposed above or below a stair-stepped area (see, e.g., SA in FIG. 19) for the word lines WL. Accordingly, because the area where the pass transistor circuit 210 is disposed overlaps the stair-stepped area of the word lines WL, despite an increase in the number of pass transistors due to an increase in the number of stacked word lines WL, the chip size of the memory device 10 need not necessarily increase. This result may be better understood, for example, upon consideration of the embodiment described in relation to FIG. 2.

Figure 2:
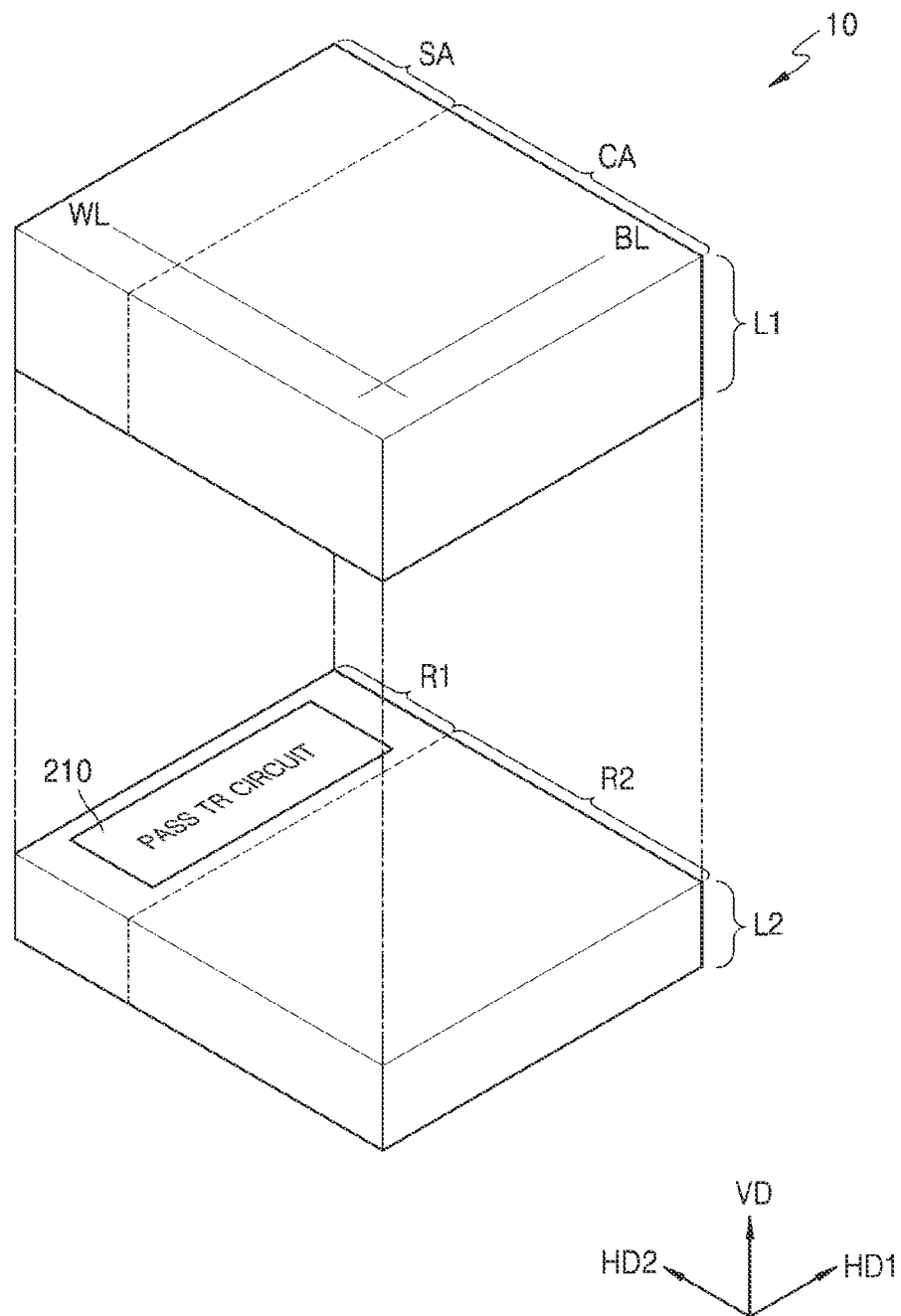
FIG. 2 is a perspective diagram illustrating one possible structure for a memory device according to embodiments of the inventive concept.

FIG. 2 is a perspective diagram illustrating one possible structure for the memory device 10 of FIG. 1.

Referring to FIGS. 1 and 2, the memory device 10 may include a first semiconductor layer L1 and a second semiconductor layer L2, wherein the first semiconductor layer L1 is stacked in a vertical direction VD on the second semiconductor layer L2. Thus, the second semiconductor layer L2 may be disposed below the first semiconductor layer L1, and the second semiconductor layer L2 may be disposed close to a supporting substrate (not specifically shown in FIG. 2). In some embodiments, the memory cell array 100 may be formed on the first semiconductor layer L1 and the peripheral circuit 200 may be formed on the second semiconductor layer L2. Accordingly, the memory device 10 may have a structure in which the memory cell array 100 is disposed above some peripheral circuits, that is, a Cell Over Periphery (COP) structure.

The first semiconductor layer L1 may include a cell area CA including memory cells and a stair-stepped area SA disposed in the cell area CA. In the first semiconductor layer L1, bit lines BL may extend in a first horizontal direction HD1 and word lines WL may extend in a second horizontal direction HD2. Thus, the respective "ends" of the word lines WL may be implemented in a stair-stepped configuration. Accordingly, as used herein, the term "stair-stepped area" (or "word line extension area") refers to an area including an arrangement of stair-stepped word line WL ends.

Thus, the second semiconductor layer L2 may include a substrate, and the peripheral circuit 200 may be formed on the second semiconductor layer L2 by forming a pattern for wiring semiconductor elements such as transistors and elements on the substrate. After the peripheral circuit 200 is formed in the second semiconductor layer L2, a first semiconductor layer L1 including the memory cell array 100 may be formed, and patterns for electrically connecting the word lines WL and bit lines BL of the memory cell array 100 to the peripheral circuit 200 formed in the second semiconductor layer L2 may be formed. The second semiconductor layer L2 may include a first area R1 corresponding to the stair-stepped area SA and a second area R2 corresponding to the cell area CA. In some embodiments, the pass transistor circuit 210 may be disposed in the first area R1, but the inventive concept is not limited thereto.

As described above, the memory device 10 may have a COP structure, and the pass transistor circuit 210 may be disposed under the stair-stepped area SA. With this configuration, pass transistors included in different memory blocks and connected to word lines disposed at the same level may be adjacently disposed, such that loading times for the word lines may be similarly implemented. However, the inventive concept is not limited thereto, and the memory device 10 may have a non-COP structure. In such a case, the pass transistor circuit 210 may be adjacently disposed to the memory cell array 100 in a horizontal direction.

Figure 3:
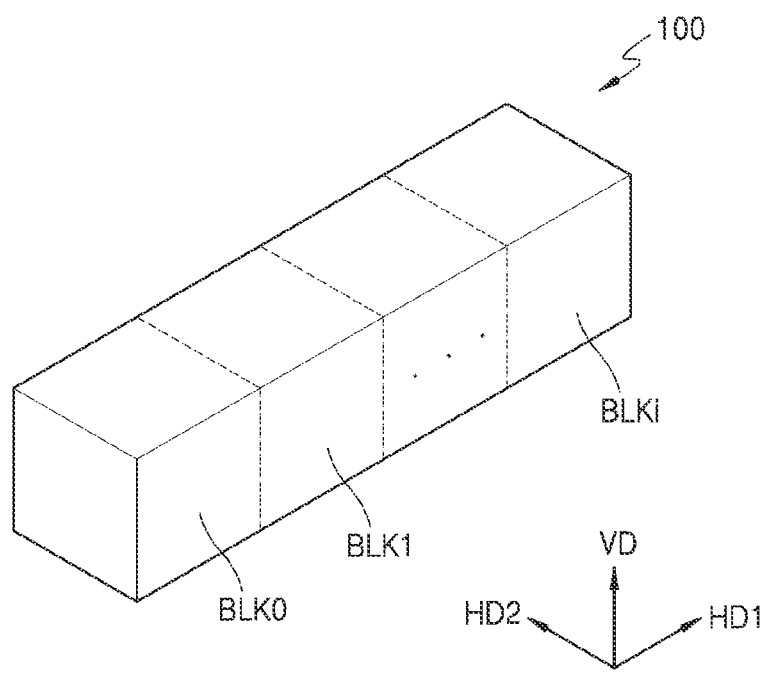
FIG. 3 is a perspective diagram illustrating a memory cell array according to embodiments of the inventive concept.

FIG. 3 is a perspective diagram illustrating in one example a memory cell array 100 according to embodiments of the inventive concept.

Referring to FIG. 3, the memory cell array 100 may include multiple memory blocks (e.g., BLK0 to BLKi, wherein 'i' is a positive integer). Here, Each of the memory blocks BLK0 to BLKi may have a 3D structure (or a vertical structure). That is, each of the memory blocks BLK0 to BLKi may include vertically arranged NAND strings. In this case, the NAND strings may be provided spaced apart the first and second horizontal directions HD1 and HD2. The memory blocks BLK0 to BLKi may be selected by the row decoder 220 of FIG. 1. For example, the row decoder 220 may select a memory block corresponding to a block address from among the memory blocks BLK0 to BLKi.

Figure 4:
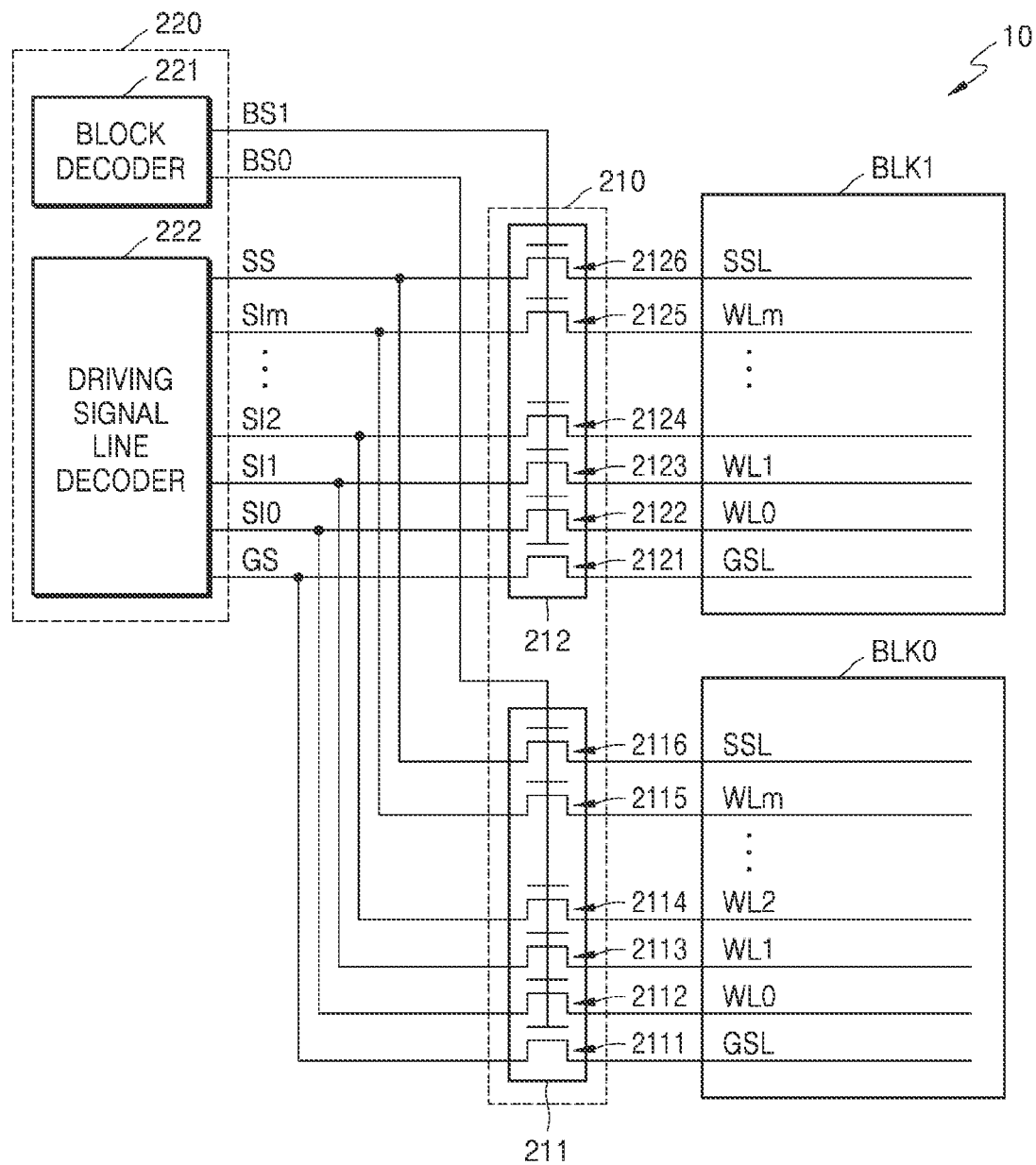
FIG. 4 is a block diagram further illustrates the row decoder 220 and the pass transistor circuit 210 in relation to a memory block in the memory device according to embodiments of the inventive concept.

FIG. 4 is a block diagram further illustrating the row decoder 220 and the pass transistor circuit 210 of FIG. 1 in relation to a first memory block BLK0 and a second memory block BLK1 according to embodiments of the inventive concept.

Referring to FIG. 4, the pass transistor circuit 210 may include pass transistor circuits respectively corresponding to corresponding memory blocks. The first and second memory blocks BLK0 and BLK1 may be adjacently disposed, wherein each of the first and second memory blocks BLK0 and BLK1 may include a ground selection line GSL, word lines WL0 to WLm, and a string selection line SSL, where 'm' is a positive integer.

The row decoder 220 may include a block decoder 221 and a driving signal line decoder 222. The pass transistor circuit 210 may include a pass transistor circuit 211 corresponding to the first memory block BLK0 and a pass transistor circuit 212 corresponding to the second memory block BLK1. The pass transistor circuit 211 may include pass transistors 2111 to 2116, and the pass transistor circuit 212 may include pass transistors 2121 to 2126.

The block decoder 221 may be connected to the pass transistor circuit 211 through a first block selection signal line BS0, and may be connected to the pass transistor circuit 212 through a second block selection signal line BL1. The first block selection signal line BS0 may be connected to gates of the plurality of pass transistors 2111 to 2116. For example, when the first block selection signal provided through the first block selection signal line BS0 is activated, the plurality of pass transistors 2111 to 2116 may be turned ON, and accordingly, the first memory block BLK0 may be selected. Further, the second block selection signal line BS1 may be connected to gates of the pass transistors 2121 to 2126. For example, when the second block selection signal provided through the second block selection signal line BS1 is activated, the plurality of pass transistors 2121 to 2126 may be turned ON, and accordingly, the second memory block BLK1 may be selected.

The driving signal line decoder 222 may be connected to the pass transistor circuits 211 and 212 through the string selection line driving signal line SS, the word line driving signal lines SI0 to SIm, and the ground selection line driving signal line GS. That is, the string selection line driving signal line SS, the word line driving signal lines SI0 to SIm, and the ground selection line driving signal line GS may be respectively connected to sources of the pass transistors 2111 to 2116 and 2121 to 2126.

The pass transistor circuit 211 may be connected to the first memory block BLK0 through a ground selection line GSL, word lines WL0 to WLm, and a string selection line SSL. The pass transistor 2111 may be connected between the ground selection line driving signal line GS and the ground selection line GSL. The pass transistors 2112 to 2115 may be respectively connected between the word line driving signal lines SI0 to SIm and the word lines WL0 to WLm. The pass transistor 2116 may be connected between the string selection line driving signal line SS and the string selection line SSL. For example, when the first block selection signal is activated, the pass transistors 2111 to 2116 may provide driving signals, which are provided through the ground selection line driving signal line GS, the word line driving signal lines SI0 to SIm, and the string selection line driving signal line SS, to the ground selection line GSL, the word lines WL0 to WLm, and the string selection line SSL, respectively. Exemplary descriptions of the pass transistor circuit 211 that may be applied to the pass transistor circuit 212 will be provided hereafter.

Figure 5:
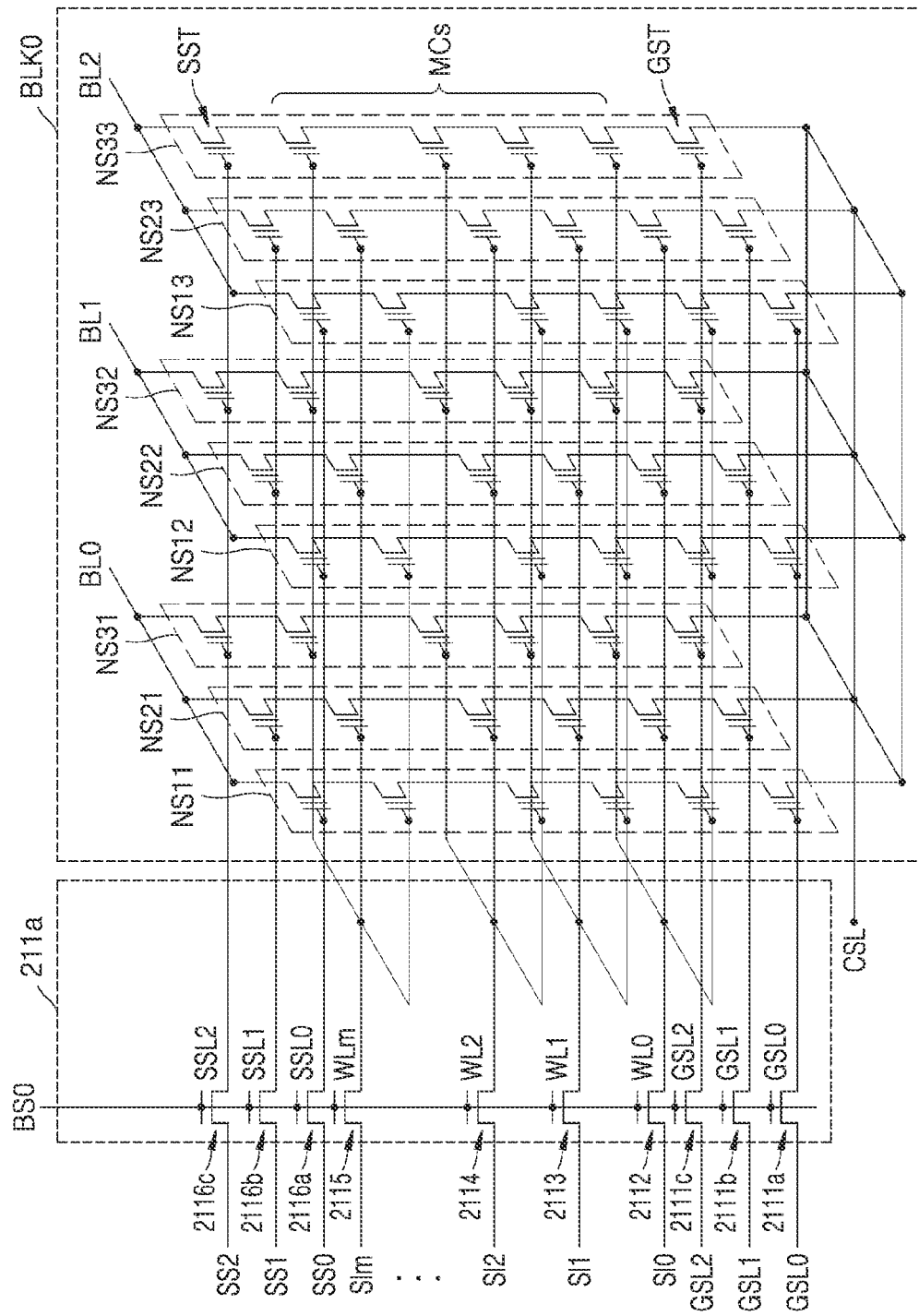
FIG. 5 is a partial circuit diagram illustrating a pass transistor circuit and a first memory block according to embodiments of the inventive concept.

FIG. 5 is a partial circuit diagram further illustrating a pass transistor circuit 211a and a first memory block BLK0 according to embodiments of the inventive concept.

Referring to FIG. 5, the pass transistor circuit 211a may correspond to an example implementation of the pass transistor circuit 211 of FIG. 4. In some embodiments, the pass transistor circuit 212 may be implemented in a substantially similar manner to the pass transistor circuit 211a, and the second memory block BLK1 may be implemented in a substantially similar manner to the first memory block BLK0. The first memory block BLK0 may include NAND strings NS11 to NS33, word lines WL0 to WLm, bit lines BL0 to BL2, ground selection lines GSL0 to GSL2, string selection lines SSL0 to SSL2 and a common source line CSL. Here, the number of NAND strings, word lines, bit lines, ground selection lines and string selection lines is a matter of design choice.

The NAND strings NS11, NS21, and NS31 are provided between the bit line BL0 and the common source line CSL, and the NAND strings NS12, NS22, and NS32 are provided between the bit line BL1 and the common source line CSL, and the NAND strings NS13, NS23, and NS33 are provided between the bit line BL2 and the common source line CSL. Each NAND string (e.g., NS33) may include a series connection of a string selection transistor SST, memory cells MCs and a ground selection transistor GST.

The string selection transistor SST is connected to the corresponding string selection lines SSL0 to SSL2. The memory cells MCs may be respectively connected to corresponding word lines WL0 to WLm. The ground selection transistor GST may be connected to the corresponding ground selection lines GSL0 to GSL2. The string selection transistor SST may be connected to the corresponding bit lines BL0 to BL2, and the ground selection transistor GST is connected to the common source line CSL.

In some embodiments, word lines (e.g., WL1) at the same height (i.e., word lines arranged at the same level) may be commonly connected, however, the string selection lines SSL0 to SSL2 and the ground selection lines GSL0 to GSL2 may be separated. In FIG. 5, three string selection lines SSL0 to SSL2 share a word line at the same height, but the inventive concept is not limited thereto. For example, two string selection lines may share a word line at the same height, or four string selection lines may share a word line at the same height.

The pass transistor circuit 211a may include pass transistors 2111a to 2111c respectively connected to ground selection lines GSL0 to GSL2, pass transistors 2112 to 2115 respectively connected to the word lines WL0 to WLm, and pass transistors 2116a to 2116c respectively connected to the string selection lines SSL0 to SSL2. The pass transistors 2111a to 2111c, 2112 to 2115, and 2116a to 2116c may be turned ON/OFF according to a first block selection signal provided along the first block selection signal line BS0, and may provide driving signals, which are provided through the string selection line driving signal lines SS0 to SS2, the word line driving signal lines SI0 to SIm, and the ground selection line driving signal lines GS0 to GS2, to the string selection lines SSL0 to SSL2, the word lines WL0 to WLm, and the ground selection lines GSL0 to GSL2, respectively.

FIG. 6 is a table listing voltage(s) that may be applied as word line driving signals for a variety of memory operations according to embodiments of the inventive concept.

Referring to FIG. 6, the selection word line driving signal line SIa may correspond to a driving signal line connected to the selected word line WLsel, and the non-selected word line driving signal line SIb may correspond to a driving signal line connected to the non-selected word line WLunsel. During the program operation, a program voltage Vpgm (e.g., about 20V) may be applied to the selected word line driving signal line SIa, and a pass voltage Vpass (e.g., about 9V) may be applied to the non-selected word line driving signal line SIb. During a read operation, a read voltage Vr (e.g., about 0V) may be applied to the selected word line driving signal line SIa, and a read pass voltage Vread (e.g., about 6V) may be applied to the non-selected word line driving signal line SIb. During the erase operation, an erase voltage Ver (e.g., about 0V) may be applied to both the selected word line driving signal line SIa and the non-selected word line driving signal line SIb.

Figure 7:
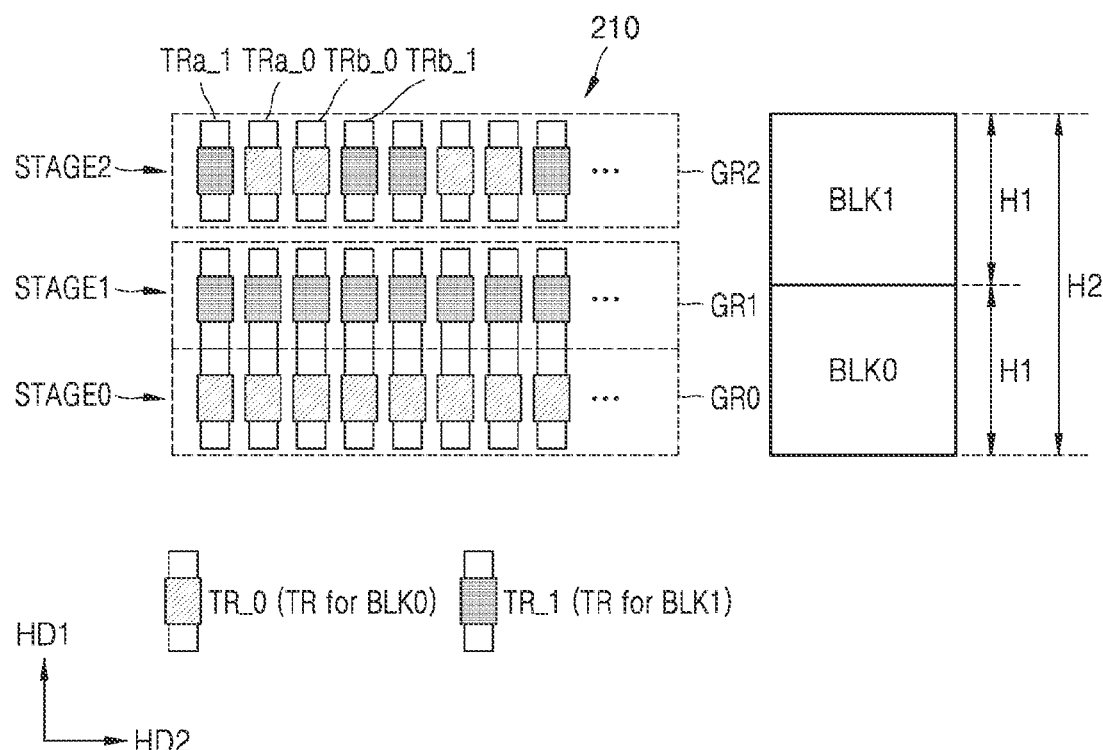

FIG. 7 is a plan view further illustrating in one example the pass transistor circuit 210 of FIG. 1.

Referring to FIG. 7, the first and second memory blocks BLK0 and BLK1 may be adjacently disposed (e.g., in the first horizontal direction HD1). The size of each of the first and second memory blocks BLK0 and BLK1 in the first horizontal direction HD1 may correspond to a first block height H1 (e.g., a one block height). However, the collective size of the first and second memory blocks BLK0 and BLK1 in the first horizontal direction HD1 may be referred to as a second block height H2 (e.g., a two block height).

The pass transistor circuit 210 may include first pass transistors TR_0 corresponding to the first memory block BLK0, and second pass transistors TR_1 corresponding to the second memory block BLK1. The pass transistor circuit 210 may be adjacently disposed to the first and second memory blocks BLK0 and BLK1 in the second horizontal direction HD2. The size of the pass transistor circuit 210 in the first horizontal direction HD1 may correspond to the second block height H2. For example, as illustrated in FIGS. 2 and 4, the first and second memory blocks BLK0 and BLK1 may be disposed on the first semiconductor layer L1, and the pass transistor circuit 210 may be disposed in the first area R1 corresponding to the stair-stepped area SA of the word lines WL connected to the first and second memory blocks BLK0 and BLK1 in the second semiconductor layer L2.

The first and second pass transistors TR_0 and TR_1 included in the pass transistor circuit 210 may be divided into an odd number of pass transistor groups disposed in the first horizontal direction HD1. For example, the first and second pass transistors TR_0 and TR_1 may be divided into first, second and third pass transistor groups GR0, GR1 and GR2. The first pass transistor group GR0 may be disposed in the first stage STAGE0, the second pass transistor group GR1 may be disposed in the second stage STAGE1, and the third pass transistor group GR2 may be disposed in the third stage STAGE2.

In some embodiments, the first pass transistor group GR0 may include some of the first pass transistors TR_0, the second pass transistor group GR1 may include some of the second pass transistors TR_1, and the third pass transistor group GR2 may include the remaining or the rest of the first pass transistors TR_0 and the remaining or the rest of the second pass transistors TR_1. In the third pass transistor group GR2, the first and second pass transistors TR_0 and TR_1 connected to the same word line disposed at the same level as each other may be adjacently disposed.

For example, the first pass transistor TRa_0 and the second pass transistor TRa_1 included in the third pass transistor group GR2 may be connected to a first word line (e.g., WL0) disposed at the same level. In addition, for example, the first pass transistor TRb_0 and the second pass transistor TRb_1 included in the third pass transistor group GR2 may be connected to a second word line (e.g., WL1) disposed at the same level. In this case, the first pass transistor TRa_0 and the first pass transistor TRb_0 may be disposed adjacent to each other. In an embodiment, the space between the first pass transistor TRa_0 and the second pass transistor TRa_1 may be larger than the space between the first pass transistor TRa_0 and the first pass transistor TRb_0, but the inventive concept is not limited thereto.

FIG. 8 is a plan view further illustrating some of the pass transistors included in the pass transistor circuit 210 of FIG. 7.

Referring to FIG. 8, a first pass transistor group GR0 may include first pass transistors TR11 and TR12 disposed in a first stage STAGE0. The first pass transistor TR11 may include a gate G11 connected to the first block selection signal line BS0, a source S11 connected to a word line driving signal line (e.g., SI2), and a drain D11 connected to a word line (e.g., WL2 of BLK0). The first pass transistor TR12 may include a gate G12 connected to the first block selection signal line BS0, a source S12 connected to a word line driving signal line (e.g., SI3), and a drain D12 connected to a word line (e.g., WL3 of BLK0).

The second pass transistor group GR1 may include second pass transistors TR21 and TR22 disposed in the second stage STAGE1. The second pass transistor TR21 may include a gate G21 connected to the second block selection signal line BS1, a source S21 connected to a word line driving signal line (e.g., SI2), and a drain D21 connected to a word line (e.g., WL2 of BLK1). The second pass transistor TR22 may include a gate G22 connected to the second block selection signal line BS1, a source S22 connected to a word line driving signal line (e.g., SI3), and a drain D22 connected to a word line (e.g., WL3 of BLK1).

In the first and second pass transistor groups GR0 and GR1, the active area of the first and second pass transistors TR11 and TR21, TR12 and TR22 adjacent in the first horizontal direction HD1 may be shared. The sources S11 and S21 may be formed in an active area sharing method, and for example, the word line driving signal line SI2 may be connected to the sources S11 and S21. Similarly, the sources S12 and S22 may be formed in an active area sharing method, and for example, the word line driving signal line SI3 may be connected to the sources S12 and S22.

The third pass transistor group GR2 may include a first pass transistor TR32 and a second pass transistor TR31 disposed in the third stage STAGE2. The first pass transistor TR32 may include a gate G32 connected to the first block selection signal line BS0, a source S32 connected to a word line driving signal line (e.g., SI0), and a drain D32 connected to a word line (e.g., WL0 of BLK0). The second pass transistor TR31 may include a gate G31 connected to the second block selection signal line BS1, a source S31 connected to a word line driving signal line (e.g., SI0), and a drain D31 connected to a word line (e.g., WL0 of BLK1). In this way, in the third pass transistor group GR2, the drains D32 and D31, respectively, included in the first and second pass transistors TR32 and TR31 adjacent in the second horizontal direction HD2 may be connected to a word line (e.g., WL0) disposed at the same level.

Figure 9:
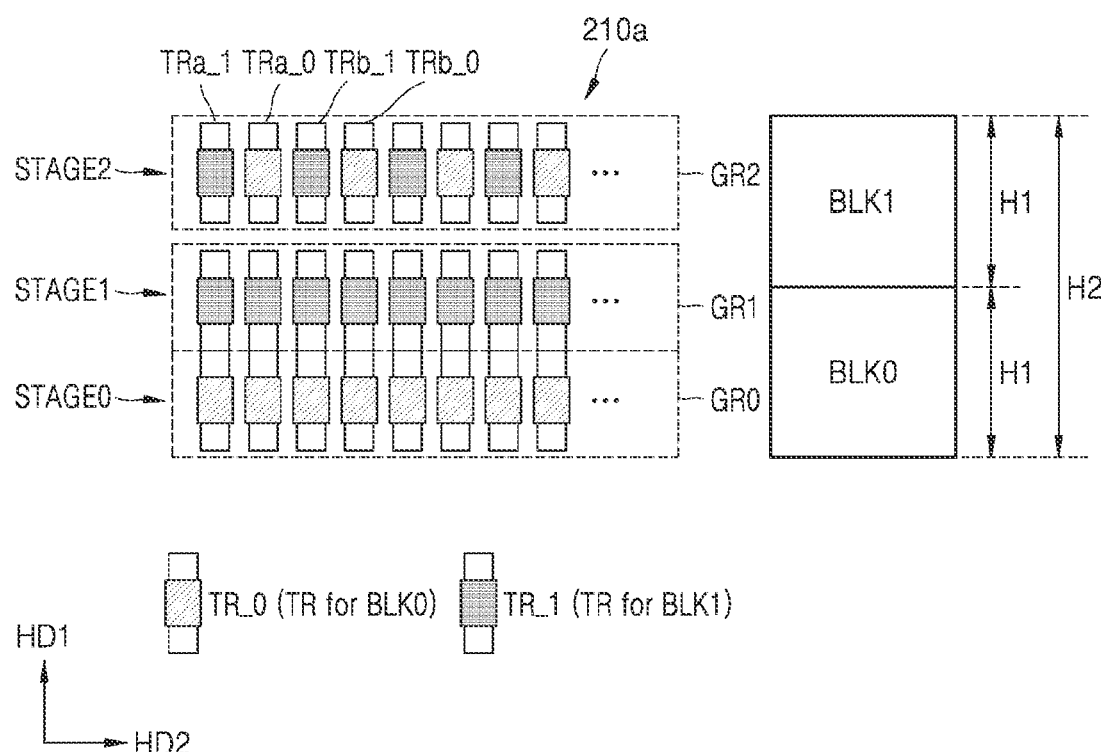

FIG. 9 is a plan view illustrating a pass transistor circuit 210a according to embodiments of the inventive concept.

Referring to FIG. 9, the pass transistor circuit 210a may be understood as a modified version of the pass transistor circuit 210 of FIG. 7. Referring to FIGS. 7, 8, and 9, in the third pass transistor group GR2, the first pass transistor TR_0 corresponding to the first memory block BLK0 and the second pass transistor TR_1 corresponding to the second memory block BLK1 may be alternately disposed. For example, the first pass transistor TRa_0 and the second pass transistor TRb_1 may be disposed adjacent to each other. In an embodiment, the space between the first pass transistor TRa_0 and the second pass transistor TRa_1 may be equal to the space between the first pass transistor TRa_0 and the first pass transistor TRb_0, but the inventive concept is not limited thereto.

FIG. 10 is a plan view illustrating a pass transistor circuit 210b according to embodiments of the inventive concept.

Referring to FIG. 10, the pass transistor circuit 210b may be understood as a modified version of the pass transistor circuit 210 of FIG. 7. Referring to FIGS. 7, 8 and 10, the first and second pass transistors TR_0 and TR_1 included in the pass transistor circuit 210b may be divided into first to fifth pass transistor groups GR0 to GR4 disposed in the first horizontal direction HD1. The first pass transistor group GR0 may be disposed in the first stage STAGE0, the second pass transistor group GR1 may be disposed in the second stage STAGE1, the third pass transistor group GR2 may be disposed in the third stage STAGE2, the fourth pass transistor group GR3 may be disposed in the fourth stage STAGE3, and the fifth pass transistor group GR4 may be disposed in the fifth stage STAGE4.

In an embodiment, the first pass transistor group GR0 may include some of the first pass transistors TR_0, and the second pass transistor group GR1 may include some of the second pass transistors TR_1. The first and second pass transistors TR_0 and TR_1 adjacent in the first horizontal direction HD1 in the first and second pass transistor groups GR0 and GR1 may share an active area. The third pass transistor group GR2 may include another part of the first pass transistors TR_0, and the fourth pass transistor group GR3 may include another part of the second pass transistor TR_1. The first and second pass transistors TR_0 and TR_1 adjacent in the first horizontal direction HD1 in the third and fourth pass transistor groups GR2 and GR3 may share an active area.

The fifth pass transistor group GR4 may include the rest of the first pass transistors TR_0 and the rest of the second pass transistors TR_1. In the fifth pass transistor group GR4, the first and second pass transistors TR_0 and TR_1 connected to the same word line disposed at the same level as each other may be disposed adjacent to each other. For example, the first pass transistor TRa_0 and the second pass transistor TRa_1 included in the fifth pass transistor group GR4 may be connected to a first word line (e.g., WL0) disposed at the same level.

Figure 11:
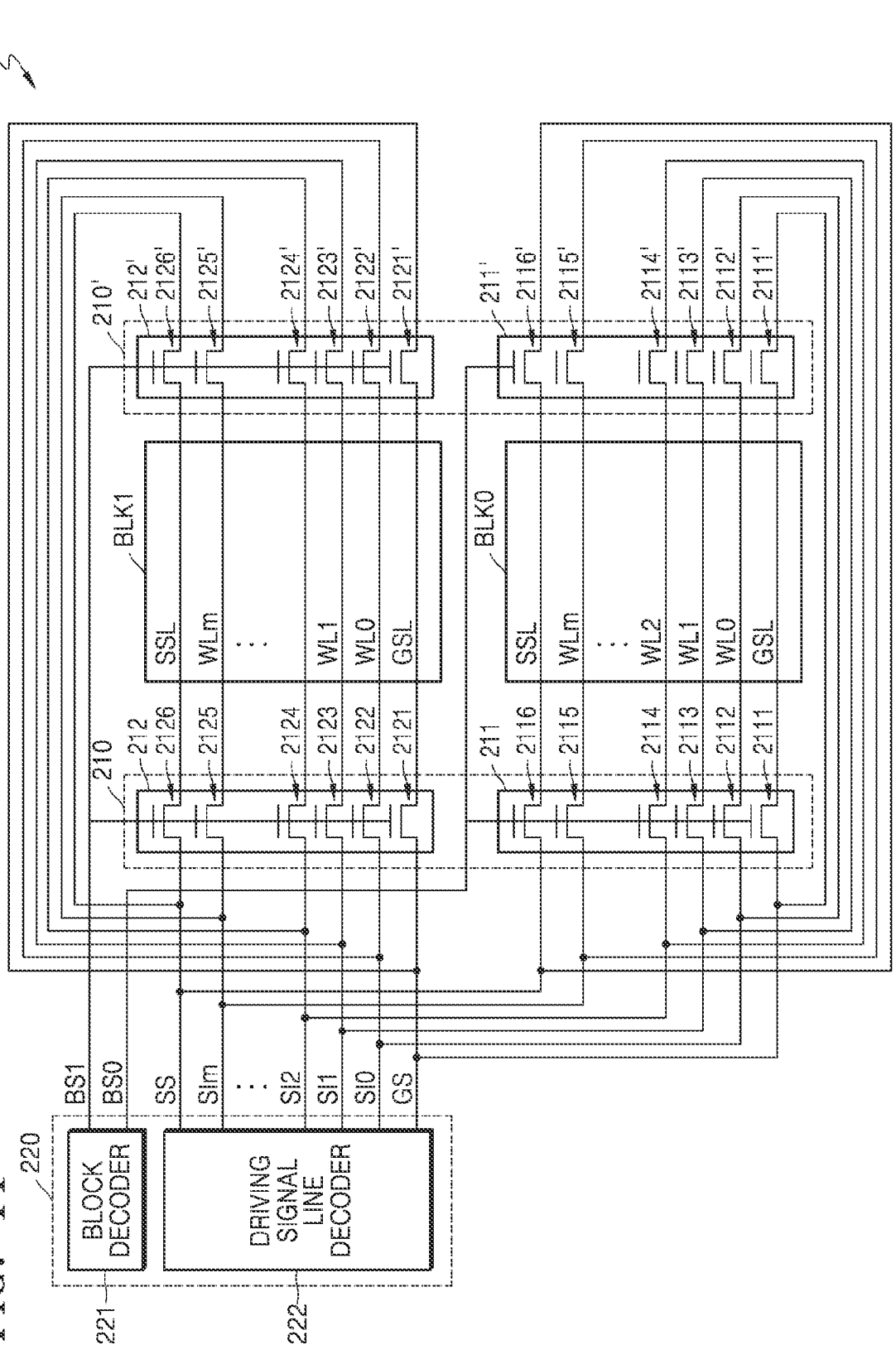
FIG. 11 is a block diagram further illustrates the row decoder 220 and the pass transistor circuit 210 in relation to first and second memory blocks in a memory device according to embodiments of the inventive concept.

FIG. 11 is a block diagram illustrating a row decoder 220, pass transistor circuits 210 and 210', and first and second memory blocks BLK0 and BLK1 according to embodiments of the inventive concept.

Referring to FIG. 11, a memory device 10' may include the pass transistor circuits 210 and 210', and each of the pass transistor circuits 210 and 210' may include a plurality of pass transistor circuits respectively corresponding to a plurality of memory blocks. The memory device 10' may be understood as a modified version of the memory device 10 of FIG. 4.

Referring to FIGS. 4 and 11, the pass transistor circuit 210 may be disposed on one side of the first and second memory blocks BLK0 and BLK1 (e.g., on the left side), and may include a pass transistor circuit 211 corresponding to the first memory block BLK0 and a pass transistor circuit 212 corresponding to the second memory block BLK1. The pass transistor circuit 210' may be disposed on the other side of the first and second memory blocks BLK0 and BLK1 (e.g., on the right side), and may include a pass transistor circuit 211' corresponding to the first memory block BLK0 and a pass transistor circuit 212' corresponding to the second memory block BLK1. The pass transistor circuit 211' may include pass transistors 2111' to 2116', and the second pass transistor circuit 212' may include pass transistors 2121' to 2126'.

The block decoder 221 may be connected to the pass transistor circuits 211 and 211' through the first block selection signal line BS0, and may be connected to the pass transistor circuits 212 and 212' through the second block selection signal line BS1. The first block selection signal line BS0 may be connected to gates of the pass transistors 2111 to 2116 and 2111' to 2116'. For example, when the first block selection signal provided through the first block selection signal line BS0 is activated, the pass transistors 2111 to 2116 and 2111' to 2116' may be turned ON, and accordingly, the first memory block BLK0 may be selected. In addition, the second block selection signal line BS1 may be connected to gates of the pass transistors 2121 to 2126 and 2121' to 2126'. For example, when the second block selection signal provided through the second block selection signal line BS1 is activated, the pass transistors 2121 to 2126 and 2121' to 2126' may be turned ON, and accordingly, the second memory block BLK1 may be selected.

The driving signal line decoder 222 may be connected to the pass transistor circuits 211, 212, 211', and 212', through the string selection line driving signal line SS, the word line driving signal lines SI0 to SIm, and the ground selection line driving signal line GS. Specifically, the string selection line driving signal line SS, the word line driving signal lines SI0 to SIm, and the ground selection line driving signal line GS may be connected to sources of the pass transistors 2111 to 2116, 2121 to 2126, 2111' to 2116', and 2121' to 2126', respectively.

The first pass transistor circuit 211' may be connected to the first memory block BLK0 through a ground selection line GSL, a plurality of word lines WL0 to WLm, and a string selection line SSL. The pass transistor 2111' may be connected between the ground selection line driving signal line GS and the ground selection line GSL. The pass transistors 2112' to 2115' may be connected between the word line driving signal lines SI0 to SIm and the word lines WL0 to WLm, respectively. The pass transistor 2116' may be connected between the string selection line driving signal line SS and the string selection line SSL. For example, when the first block selection signal is activated, the pass transistors 2111' to 2116' may provide driving signals, which are provided through the ground selection line driving signal line GS, the word line driving signal lines SI0 to SIm, and the string selection line driving signal line SS, to the ground selection line GSL, the word lines WL0 to WLm, and the string selection line SSL, respectively. The previous description of the first pass transistor circuit 211' may also be applied to the second pass transistor circuit 212'.

As described above, the pass transistors may be disposed at both ends of the word lines WL0 to WLm of each of the first and second memory blocks BLK0 and BLK1. For example, pass transistors 2112 and 2112' may be disposed at both ends of the first word line WL0. However, the inventive concept is not limited thereto, and in some embodiments, pass transistors connected to odd-numbered word lines may be disposed on one side of each memory block, and pass transistors connected to even-numbered word lines may be disposed on the other side.

Figure 12:
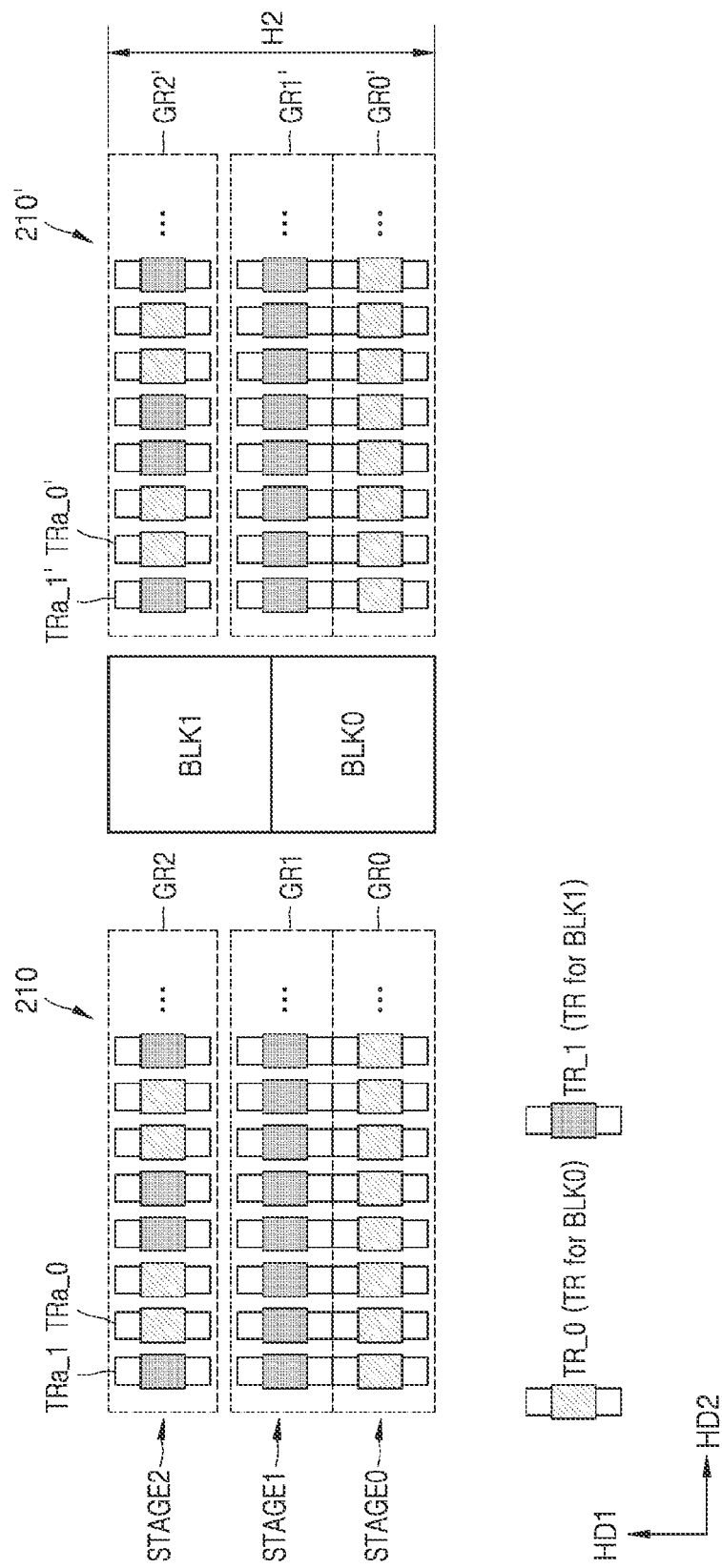

FIG. 12 is a plan view illustrating the pass transistor circuits 210 and 210' according to embodiments of the inventive concept.

Referring to FIG. 12, the first and second memory blocks BLK0 and BLK1 may be adjacently disposed in the first horizontal direction HD1. Each of the pass transistor circuits 210 and 210' may include first pass transistors TR_0 corresponding to the first memory block BLK0 and second pass transistors TR_1 corresponding to the second memory block BLK1. The pass transistor circuit 210 may be disposed on the left side of the first and second memory blocks BLK0 and BLK1, and the pass transistor circuit 210' may be disposed on the right side of the first and second memory blocks BLK0 and BLK1. The size of each of the pass transistor circuits 210 and 210' in the first horizontal direction HD1 may be the second block height H2.

The pass transistor circuits 210 and 210' may be implemented in substantially the same manner Hence, the previous description of the pass transistor circuits 210, 210a, and 210b in relation to FIGS. 7 to 10 may also be applied here. The first and second pass transistors TR_0 and TR_1 included in the pass transistor circuit 210' may be divided into first to third pass transistor groups GR0' to GR2'. The first pass transistor group GR0' may be disposed in the first stage STAGE0, the second pass transistor group GR1' may be disposed in the second stage STAGE1, and the third pass transistor group GR2' may be disposed in the third stage STAGE2. Here, in the first and second pass transistor groups GR0' and GR1', the first and second pass transistors TR_0 and TR_1 adjacent in the first horizontal direction HD1 may share an active area.

In some embodiments, the first pass transistor group GR0' may include some of the first pass transistors TR_0, the second pass transistor group GR1' may include some of the second pass transistors TR_1, and the third pass transistor group GR2' may include the rest of the first pass transistors TR_0 and the rest of the second pass transistors TR_1. In the third pass transistor group GR2', the first and second pass transistors TR_0 and TR_1 connected to the same word line disposed at the same level may be adjacently disposed. For example, the first pass transistor TRa_0' and the second pass transistor TRa_1' included in the third pass transistor group GR2' may be connected to a first word line (e.g., WL0) disposed at the same level.

Figure 13:
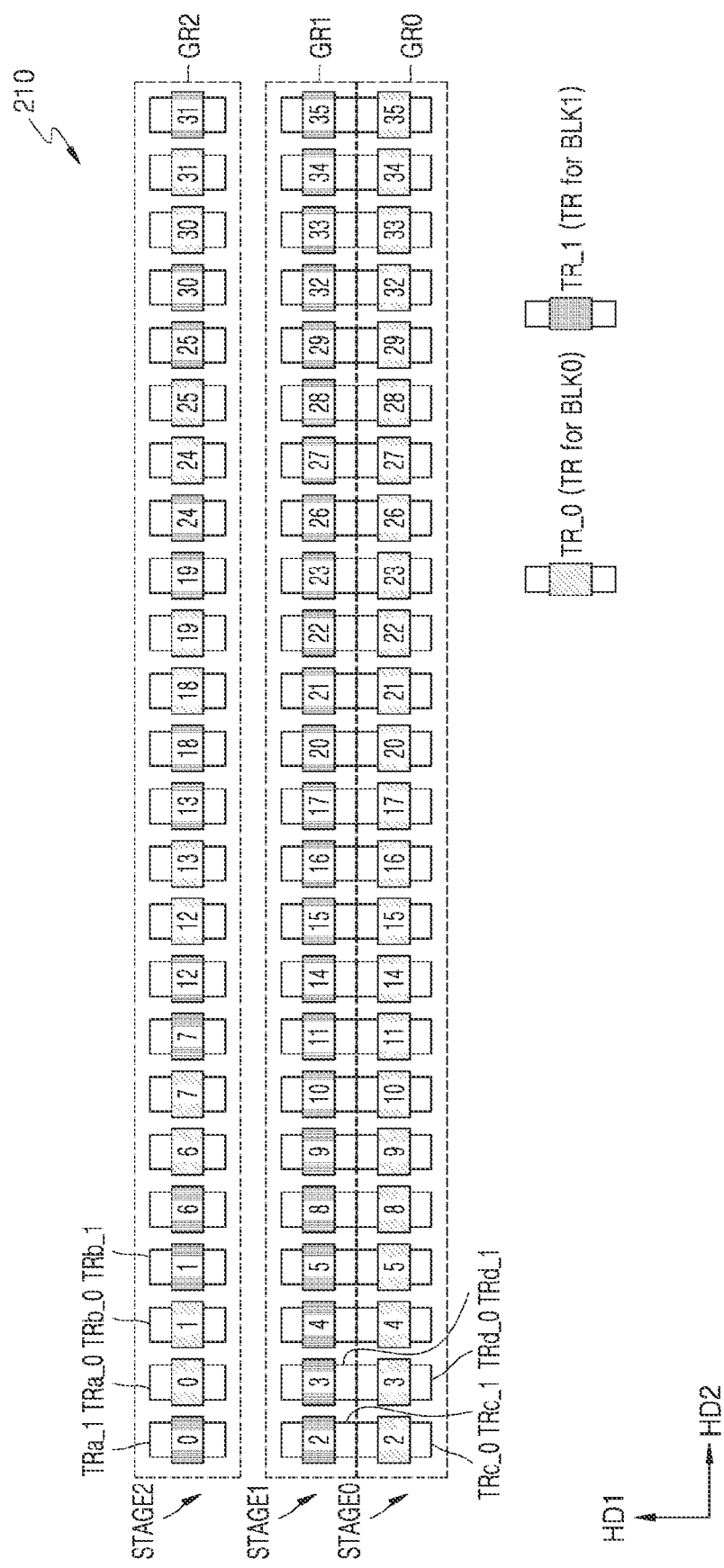

FIG. 13 is a plan view further illustrating in one example the pass transistor circuit 210 of FIG. 12.

Referring to FIG. 13, the number of first pass transistors TR_0 is assumed to be 36, and the number of second pass transistors TR_1 is assumed to be 36, but these are just working examples. In FIG. 13, the numbers displayed on the gates of the first and second pass transistors TR_0 and TR1 may correspond to the numbers of levels for the corresponding word lines. For example, in the third pass transistor group GR2, the first and second pass transistors TRa_0 and TRa_1 connected to the first word line WL0 may be adjacently disposed in the second horizontal direction HD2. Specifically, the first pass transistor TRa_0 may be connected to the first word line WL0 of the first memory block BLK0, and the second pass transistor TRa_1 may be connected to the first word line WL0 of the second memory block BLK1. For example, in the third pass transistor group GR2, the first and second pass transistors TRb_0 and TRb_1 connected to the second word line WL1 may be adjacently disposed in the second horizontal direction HD2. That is, the first pass transistor TRb_0 may be connected to the second word line WL1 of the first memory block BLK0, and the second pass transistor TRb_1 may be connected to the second word line WL1 of the second memory block BLK1.

The first pass transistor group GR0 may include first pass transistors TR_0 disposed in the second horizontal direction HD2. For example, the first pass transistor TRc_0 may be connected to the third word line WL2 of the first memory block BLK0, and the first pass transistor TRd_0 may be connected to the fourth word line WL3 of the first memory block BLK0. The second pass transistor group GR1 may include second pass transistors TR_1 disposed in the second horizontal direction HD2. For example, the second pass transistor TRc_1 may be connected to the third word line WL2 of the second memory block BLK1, and the second pass transistor TRd_1 may be connected to the fourth word line WL3 of the second memory block BLK1. In this way, the first and second pass transistors TRc_0 and TRc_1 connected to the third word line WL2 may be disposed adjacent to each other in the first horizontal direction HD1, and the first and second pass transistors TRd_0 and TRd_1 connected to the fourth word line WL3 may be disposed adjacent to each other in the first horizontal direction HD1.

Figure 14:
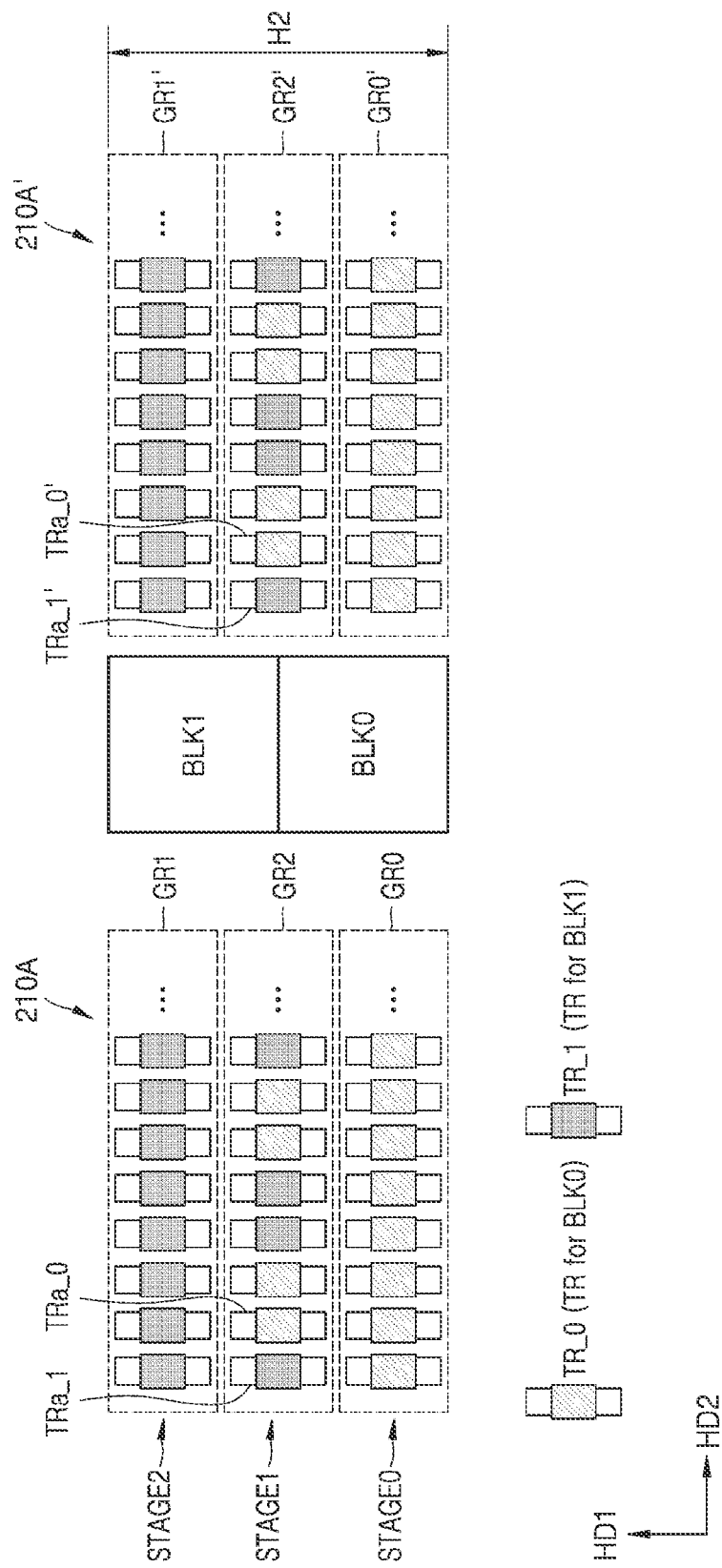

FIG. 14 is a plan view illustrating pass transistor circuits 210A and 210A' according to embodiments of the inventive concept.

Referring to FIG. 14, the pass transistor circuits 210A and 210A' may be understood as a modified version of the pass transistor circuits 210 and 210' of FIG. 12. Here, the first and second pass transistors TR_0 and TR1 adjacent in the first horizontal direction HD1 may not share the active area. The pass transistor circuits 210A and 210A' may be implemented in substantially the same manner. The first and second pass transistors TR_0 and TR_1 included in the pass transistor circuit 210A may be divided into first to third pass transistor groups GR0 to GR2. Similarly, the first and second pass transistors TR_0 and TR_1 included in the pass transistor circuit 210A' may be divided into first to third pass transistor groups GR0' to GR2'.

Each of the first pass transistor groups GR0 and GR0' may include some of the first pass transistors TR_0, each of the third pass transistor groups GR2 and GR2 ' may include some of the second pass transistors TR_1, and each of the second pass transistor groups GR1 and GR1' may include the rest of the first pass transistors TR_0 and the rest of the second pass transistors TR_1. Here, the first pass transistor groups GR0 and GR0' may be disposed in the first stage STAGE0, the third pass transistor groups GR2 and GR2' may be disposed in the second stage STAGE1, and the second pass transistor groups GR1 and GR1' may be disposed in the third stage STAGE2. However, the inventive concept is not limited thereto, and the arrangement order of the first to third pass transistor groups GR0 to GR2 and GR0' to GR2' may be variously changed. For example, the second pass transistor groups GR1 and GR1' may be disposed in the first stage STAGE0.

In the third pass transistor groups GR2 and GR2', the first and second pass transistors TR_0 and TR_1 connected to the same word line disposed at the same level as each other may be disposed adjacent to each other. For example, the first pass transistor TRa_0 and the second pass transistor TRa_1 included in the third pass transistor group GR2 may be connected to a first word line (e.g., WL0) disposed at the same level. For example, the first pass transistor TRa_0' and the second pass transistor TRa_1' included in the third pass transistor group GR2' may be connected to a first word line (e.g., WL0) disposed at the same level.

Figure 15:
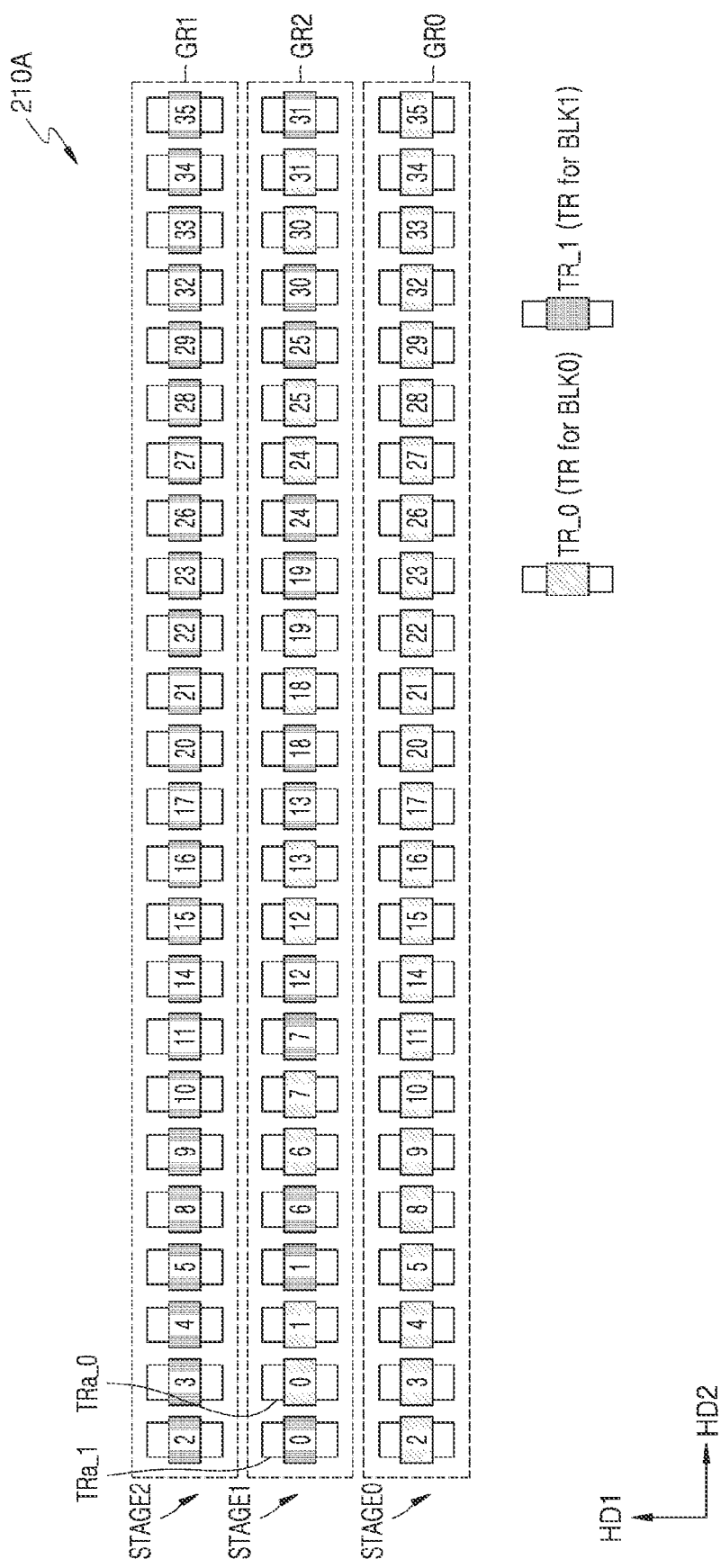

FIG. 15 is a plan view further illustrating in one example the pass transistor circuit 210A of FIG. 14.

Referring to FIG. 15, the pass transistor circuit 210A may be understood as a modified version of the pass transistor circuit 210 of FIG. 13. Referring to FIGS. 13, 14 and 15, the first and second pass transistors TR_0 and TR_1 disposed in the first to third terminals STAGE0 to STAGE2 may not share an active area with each other. In the third pass transistor group GR2, the first and second pass transistors TR_0 and TR_1 connected to the word lines disposed at the same level may be adjacently disposed in the second horizontal direction HD2.

Figure 16:
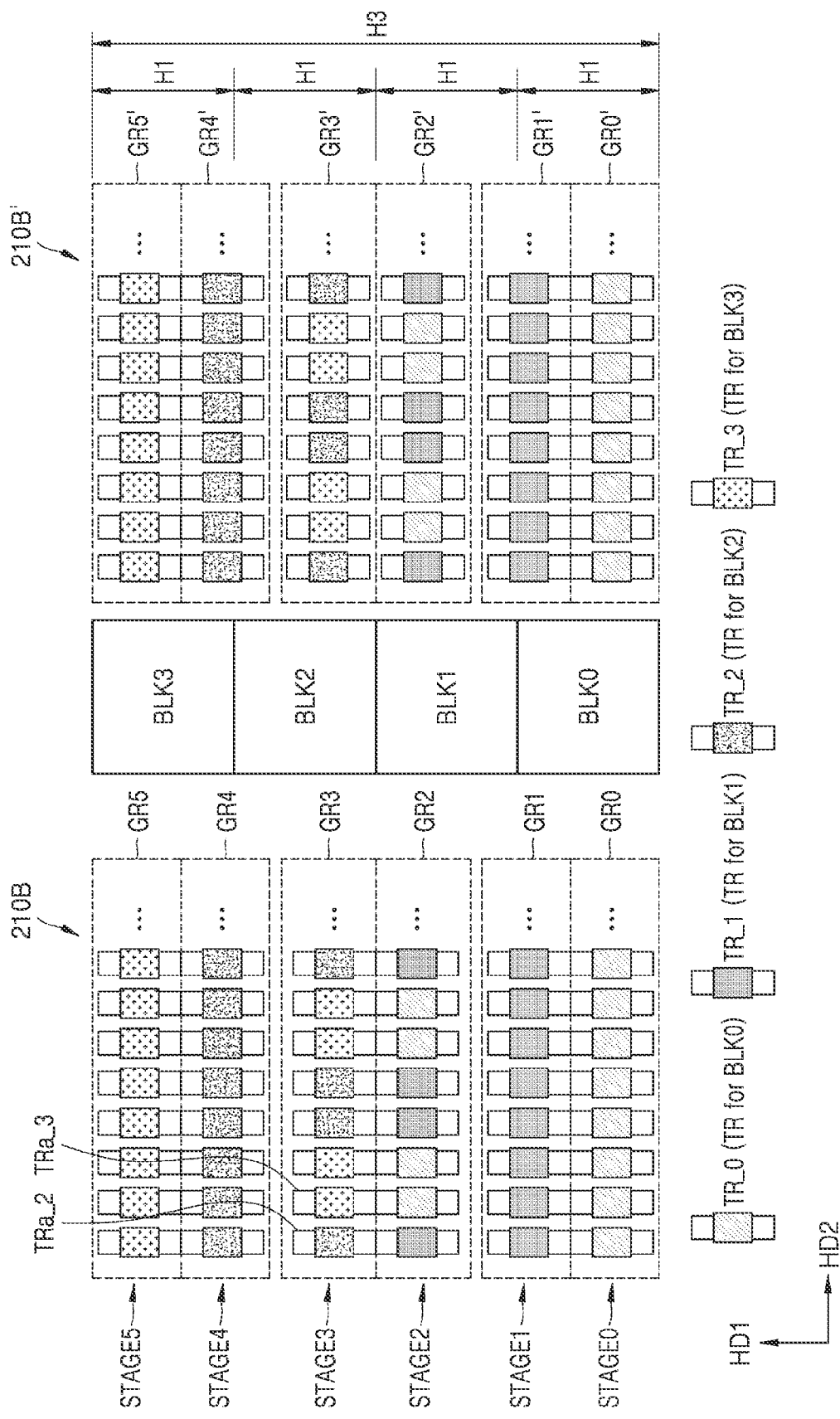

FIG. 16 is a plan view illustrating pass transistor circuits 210B and 210B' according to embodiments of the inventive concept.

Referring to FIG. 16, first to fourth memory blocks BLK0 to BLK3 may be disposed in a first horizontal direction HD1. The size of each of the first to fourth memory blocks BLK0 to BLK3 in the first horizontal direction HD1 may correspond to the first block height H1, whereas the collective size of the first to fourth memory blocks BLK0 to BLK3 in the first horizontal direction HD1 may correspond to a third block height H3 (e.g., a four block height). The pass transistor circuits 210B and 210B' may be respectively understood as modified versions of the pass transistor circuits 210 and 210' of FIG. 11.

Here, the pass transistor circuit 210B may include first pass transistors TR_0 corresponding to the first memory block BLK0, second pass transistors TR_1 corresponding to the second memory block BLK1, third pass transistors TR_2 corresponding to the third memory block BLK2, and fourth pass transistors TR_3 corresponding to the fourth memory block BLK3. The pass transistor circuit 210B may be disposed on one side (e.g., on the left side) of the first to fourth memory blocks BLK0 to BLK3. The size of the pass transistor circuit 210B in the first horizontal direction HD1 may correspond to the third block height H3. For example, as illustrated in FIG. 2, the first to fourth memory blocks BLK0 to BLK3 may be disposed on the first semiconductor layer L1, and the pass transistor circuit 210B may be disposed in the first area R1 corresponding to the stair-stepped area SA of the word lines WL connected to the first to fourth memory blocks BLK0 to BLK3 in the second semiconductor layer L2.

The first and second pass transistors TR_0 and TR_1 included in the pass transistor circuit 210B may be divided into first to sixth pass transistor groups GR0 to GR5. The first pass transistor group GR0 may be disposed in the first stage STAGE0, the second pass transistor group GR1 may be disposed in the second stage STAGE1, the third pass transistor group GR2 may be disposed in the third stage STAGE2, the fourth pass transistor group GR3 may be disposed in the fourth stage STAGE3, the fifth pass transistor group GR4 may be disposed in the fifth stage STAGE4, and the sixth pass transistor group GR5 may be disposed in the sixth stage STAGE5.

In some embodiments, the first pass transistor group GR0 may include some of the first pass transistors TR_0, the second pass transistor group GR1 may include some of the second pass transistors TR_1, and the third pass transistor group GR2 may include the rest of the first pass transistors TR_0 and the rest of the second pass transistors TR_1. In the third pass transistor group GR2, the first and second pass transistors TR_0 and TR_1 connected to the same word line disposed at the same level as each other may be disposed adjacent to each other.

In some embodiments, the fifth pass transistor group GR4 may include some of the third pass transistors TR_2, the sixth pass transistor group GR5 may include some of the fourth pass transistors TR_3, and the fourth pass transistor group GR3 may include the rest of the third pass transistors TR_2 and the rest of the fourth pass transistors TR_3. In the fourth pass transistor group GR3, the third and fourth pass transistors TR_2 and TR_3 connected to the same word line disposed at the same level as each other may be disposed adjacent to each other. For example, the third pass transistor TRa_2 and the fourth pass transistor TRb_3 included in the fourth pass transistor group GR3 may be connected to a first word line (e.g., WL0) disposed at the same level. The above description of the pass transistor circuit 210B may also be applied to the pass transistor circuit 210W.

FIG. 17 further illustrates some of the pass transistors that may be included in the pass transistor circuit 210B of FIG. 15.

Referring to FIG. 17, the pass transistor circuit 210B may be understood as a modified version of the pass transistor circuit 210 of FIG. 8. Here, the fourth pass transistor group GR3 may include third and fourth pass transistors TR41 and TR42 disposed in the fourth stage STAGE3. The third pass transistor TR41 may include a gate G41 connected to a third block selection signal line, a source S41 connected to the word line driving signal line (e.g., SI0), and a drain D41 connected to the word line (e.g., WL0 of BLK2). The fourth pass transistor TR42 may include a gate G42 connected to a fourth block selection signal line, a source S42 connected to the word line driving signal line (e.g., SI0), and a drain D42 connected to the word line (e.g., WL0 of BLK3).

In the third and fourth pass transistor groups GR2 and GR3, active areas of pass transistors adjacent to the first horizontal direction HD1 may be shared. The sources S31 and S41 may be formed in an active area sharing method, and for example, the word line driving signal line SI0 may be connected to the sources S31 and S41. Similarly, the sources S32 and S42 may be formed in an active area sharing method, and for example, the word line driving signal line SI1 may be connected to the sources S32 and S32.

The fifth pass transistor group GR4 may include third pass transistors TR51 and TR52 disposed in the fifth stage STAGE4. The third pass transistor TR51 may include a gate G51 connected to a third block selection signal line, a source S51 connected to the word line driving signal line (e.g., SI2), and a drain D51 connected to the word line (e.g., WL2 of BLK2). The third pass transistor TR52 may include a gate G52 connected to a third block selection signal line, a source S52 connected to the word line driving signal line (e.g., SI3), and a drain D52 connected to the word line (e.g., WL3 of BLK2).

The sixth pass transistor group GR5 may include fourth pass transistors TR61 and TR62 disposed in the sixth stage STAGE5. The fourth pass transistor TR61 may include a gate G61 connected to a fourth block selection signal line, a source S61 connected to the word line driving signal line (e.g., SI2), and a drain D61 connected to the word line (e.g., WL2 of BLK3). The fourth pass transistor TR62 may include a gate G62 connected to a fourth block selection signal line, a source S62 connected to the word line driving signal line (e.g., SI3), and a drain D62 connected to the word line (e.g., WL3 of BLK4).

In the fifth and sixth pass transistor groups GR4 and GR5, active areas of pass transistors adjacent to the first horizontal direction HD1 may be shared. The sources S51 and S61 may be formed in an active area sharing method, and for example, the word line driving signal line SI2 may be connected to the sources S51 and S61. Similarly, the sources S52 and S62 may be formed in an active area sharing method, and for example, the word line driving signal line SI3 may be connected to the sources S52 and S62.

Figure 18:
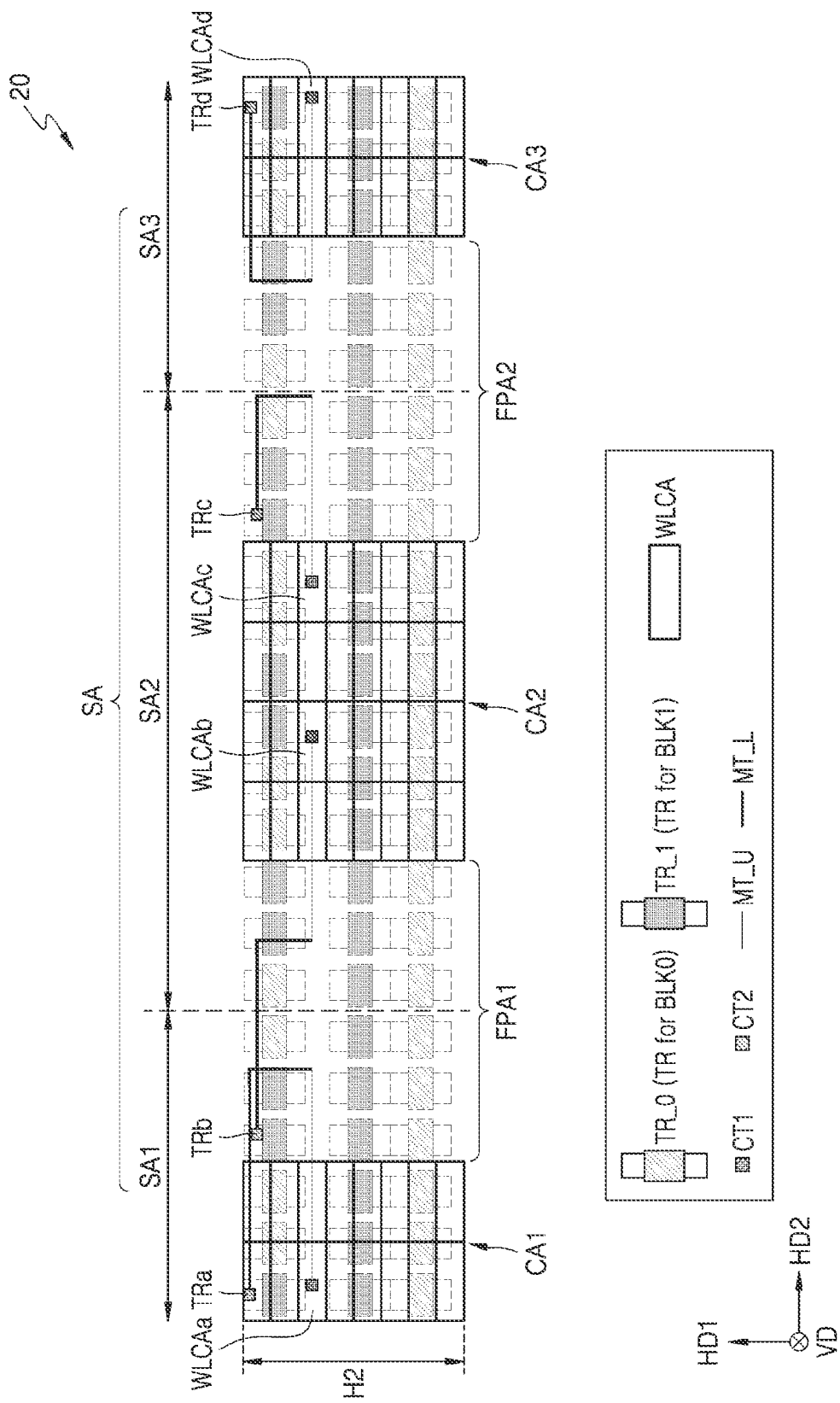
FIG. 18 is a plan view of a stair-stepped area SA of a memory device 20 according to embodiments of the inventive concept.
Figure 19:
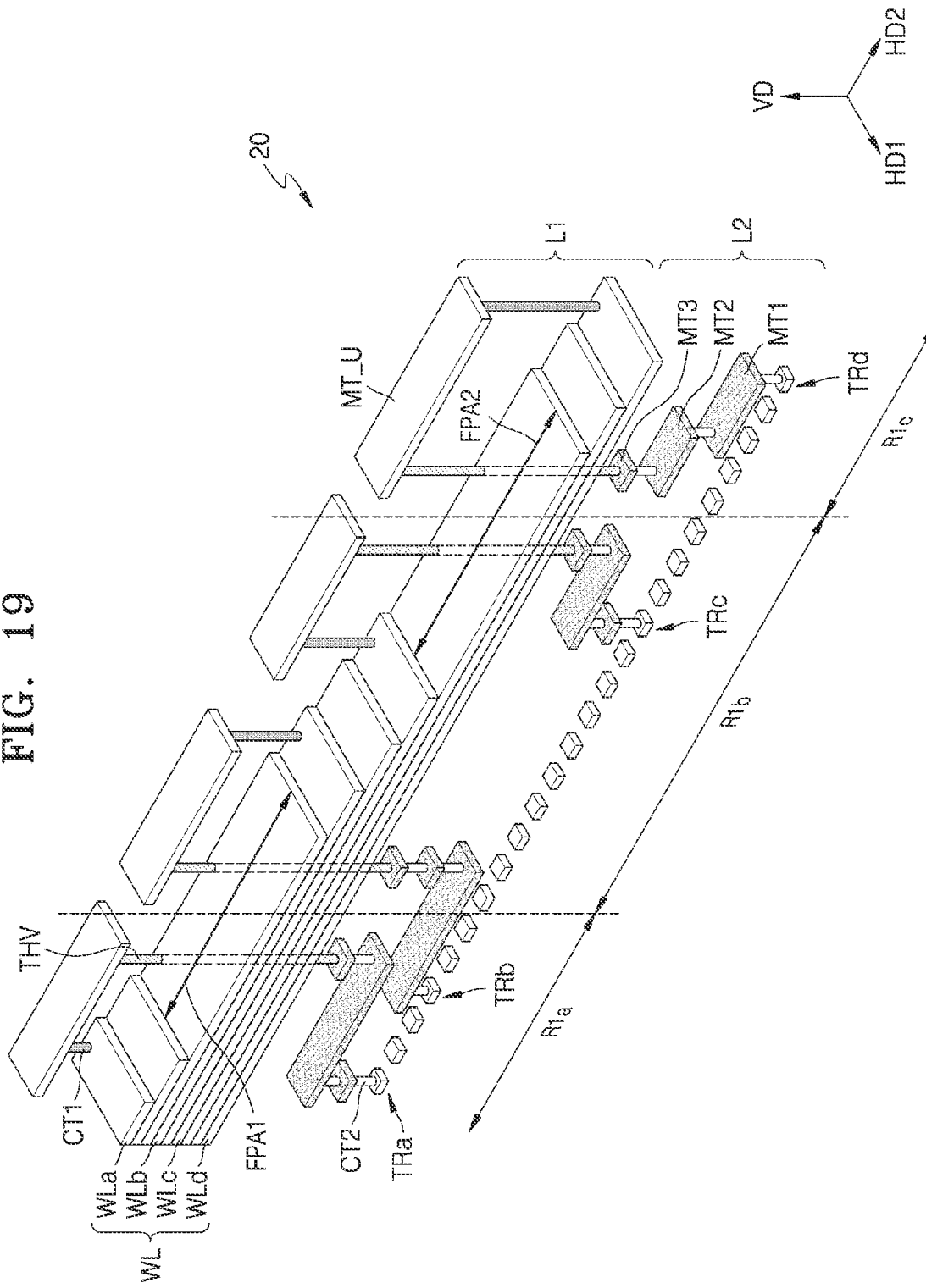
FIG. 19 is an exploded perspective view of the stair-stepped area SA of FIG. 18.

FIG. 18 is a plan view further illustrating a stair-stepped area SA of a memory device 20 according to embodiments of the inventive concept, and FIG. 19 is an exploded perspective view of the stair-stepped area SA of FIG. 18.

Referring to FIGS. 18 and 19, word lines WL may be stacked in the vertical direction VD on the first semiconductor layer L1. In the stair-stepped area SA, word lines WL may be arranged in a stair-stepped configuration. The stair-stepped area SA may be divided into first, second and third stair-stepped areas SA1, SA2 and SA3. A first contact area CA1 may be disposed in the first stair-stepped area SA1, a second contact area CA2 may be disposed in the second stair-stepped area SA2, and a third contact area CA3 may be disposed in the third stair-stepped area SA3.

The first flat pad area FPA1 may be defined between the first contact area CA1 and the second contact area CA2, and the second flat pad area FPA2 may be defined between the second contact area CA2 and the third contact area CA3. Through electrodes (e.g., through silicon vias TSV) may be disposed in the first and second flat pad areas FPA1 and FPA2. The through electrodes TSV may pass through the word lines WL as they extend in the vertical direction VD. In this case, an insulating layer may be formed between each through electrode TSV and the word lines WL, and accordingly, each through electrode TSV and the word lines WL may be electrically insulated from each other.

Each of the first to third contact areas CA1 to CA3 may include word line contact areas WLCA, and the number of word line contact areas WLCA may correspond to the number of word lines WL. In each word line contact area WLCA, a contact plug CT1 for connecting a pass transistor corresponding to the word line WL may be disposed. For example, the contact plug CT1 may be disposed in the word line contact area WLCAa, and the contact plug CT2 may be disposed in the source/drain area of the pass transistor TRa.

The contact plugs CT1 and CT2 may be electrically connected using the upper metal layer MT_U and the lower metal layer MT_L. The upper metal layer MT_U may be included in the first semiconductor layer L1 and may extend in the second horizontal direction HD2. The lower metal layer MT_L may be included in the second semiconductor layer L2 and may include first to third metal layers MT1 to MT3. For example, the first and third metal layers MT1 and MT3 may extend in a first horizontal direction HD1, and the second metal layer MT2 may extend in a second horizontal direction HD2.

The second semiconductor layer L2 may include a first area R1 disposed below the stair-stepped area SA in a vertical direction VD, and pass transistors TRa to TRd may be disposed in the first area R1. The first area R1 may be divided into first areas R1a to R11c corresponding to the first to third stair-stepped areas SA1 to SA3, respectively. The word line contact areas included in the first contact area CA1 may be connected to pass transistors disposed in the first area R1a of the second semiconductor layer L2, the word line contact areas included in the second contact area CA2 may be connected to pass transistors disposed in the first area R1b of the second semiconductor layer L2, and the word line contact areas included in the third contact area CA3 may be connected to pass transistors disposed in the first area R1c of the second semiconductor layer L2.

For example, the word line contact area WLCAa may be connected to the pass transistor TRa through the contact plug CT1, the upper metal layer MT_U, the through electrode TSV, the first to third metal layers MT1 to MT3, and the contact plug CT2. For example, the contact plug CT2 may be formed on the drain area of the pass transistor TRa. Similarly, the word line contact area WLCAb may be connected to the pass transistor TRb, the word line contact area WLCAc may be connected to the pass transistor TRc, and the word line contact area WLCAd may be connected to the pass transistor TRd.

Figure 20A:
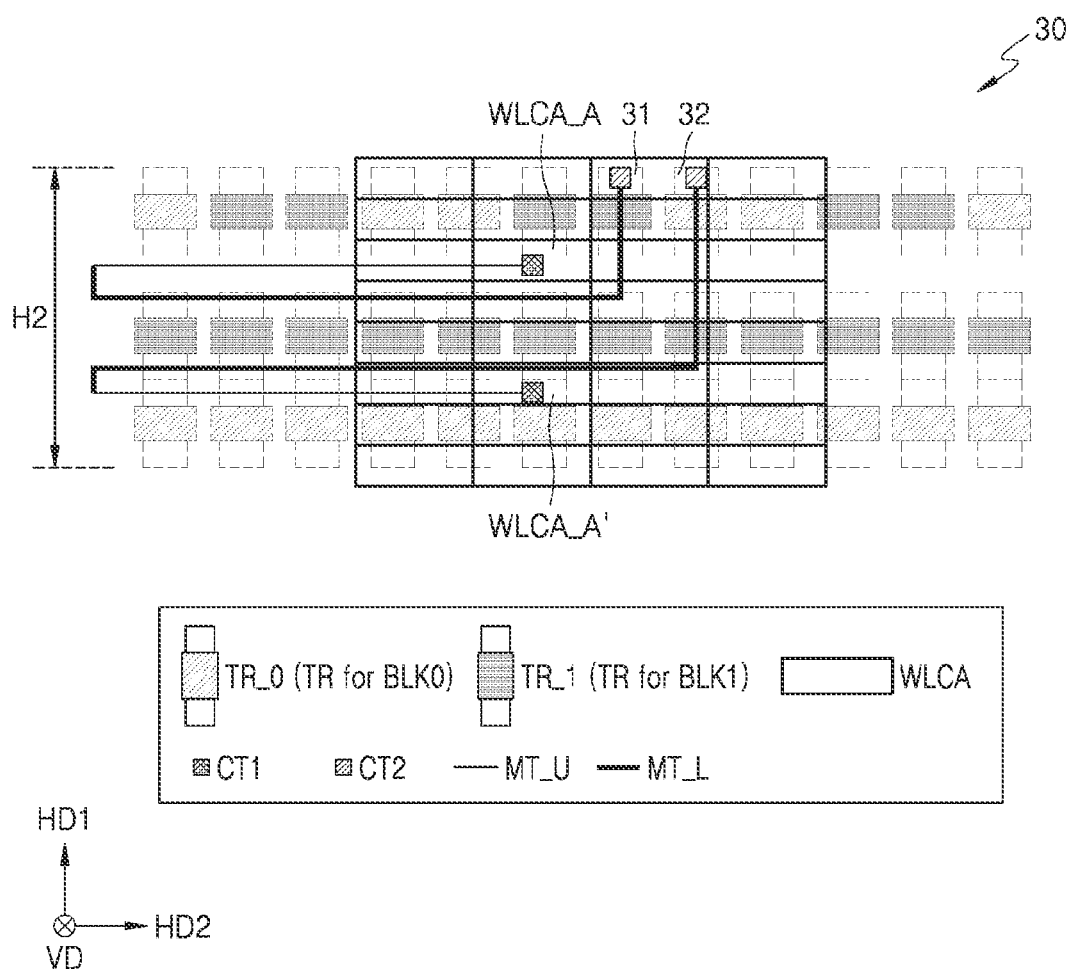
FIGS. 20A and 20B are respective plan views illustrating wiring between a pass transistor and a word line contact, and illustrating wiring between a pass transistor and a word line contact according to a comparative example for the inventive concept.

FIG. 20A illustrates an example of wiring between a pass transistor and a word line contact according to embodiments of the inventive concept.

Referring to FIGS. 2, 4, and 20A, a memory device 30 may be understood as a modified version of the memory device 20 of FIG. 18. Thus, referring to FIGS. 18, 19 and 20A, the area shown in FIG. 20A may correspond to the second stair-stepped area SA2 of FIGS. 18 and 19. Word lines WL may be stacked in a vertical direction VD and word line contact areas WLCA may be disposed in the first semiconductor layer L1. F and second pass transistors TR_0 and TR_1 may be disposed in the second semiconductor layer L2.

For example, the word line contact area WLCA_A may correspond to a contact area of the word line (e.g., WL18) of the second memory block BLK1, and the word line contact area WLCA_A' may correspond to a contact area of the word line (e.g., WL18) of the first memory block BLK0. For example, a pass transistor 31 may be connected to a word line (e.g., WL18) of the second memory block BLK1, and a pass transistor 32 may be connected to a word line (e.g., WL18) of the first memory block BLK0.

The word line contact area WLCA_A may be connected to the pass transistor 31 through the contact plug CT1, the upper metal layer MT_U, the lower metal layer MT_L, and the contact plug CT2, and the first length of the wiring connecting the word line contact area WACA_A to the pass transistor 31 may correspond to the sum of the lengths of the upper metal layer MT_U and the lower metal layer MT_L. Further, the word line contact area WLCA_A' may also be connected to the pass transistor 32 through the contact plug CT1, the upper metal layer MT_U, the lower metal layer MT_L, and the contact plug CT2, and the second length of the wiring connecting the word line contact area WACA_A to the pass transistor 32 may correspond to the sum of the lengths of the upper metal layer MT_U and the lower metal layer MT_L. Here, the difference between the first length and the second length may not be large, and accordingly, pass resistances of the word line (e.g., WL18) of the first memory block BLK0 and the word line (e.g., WL18) of the second memory block BLK1 may be similar to each other.

Figure 20B:
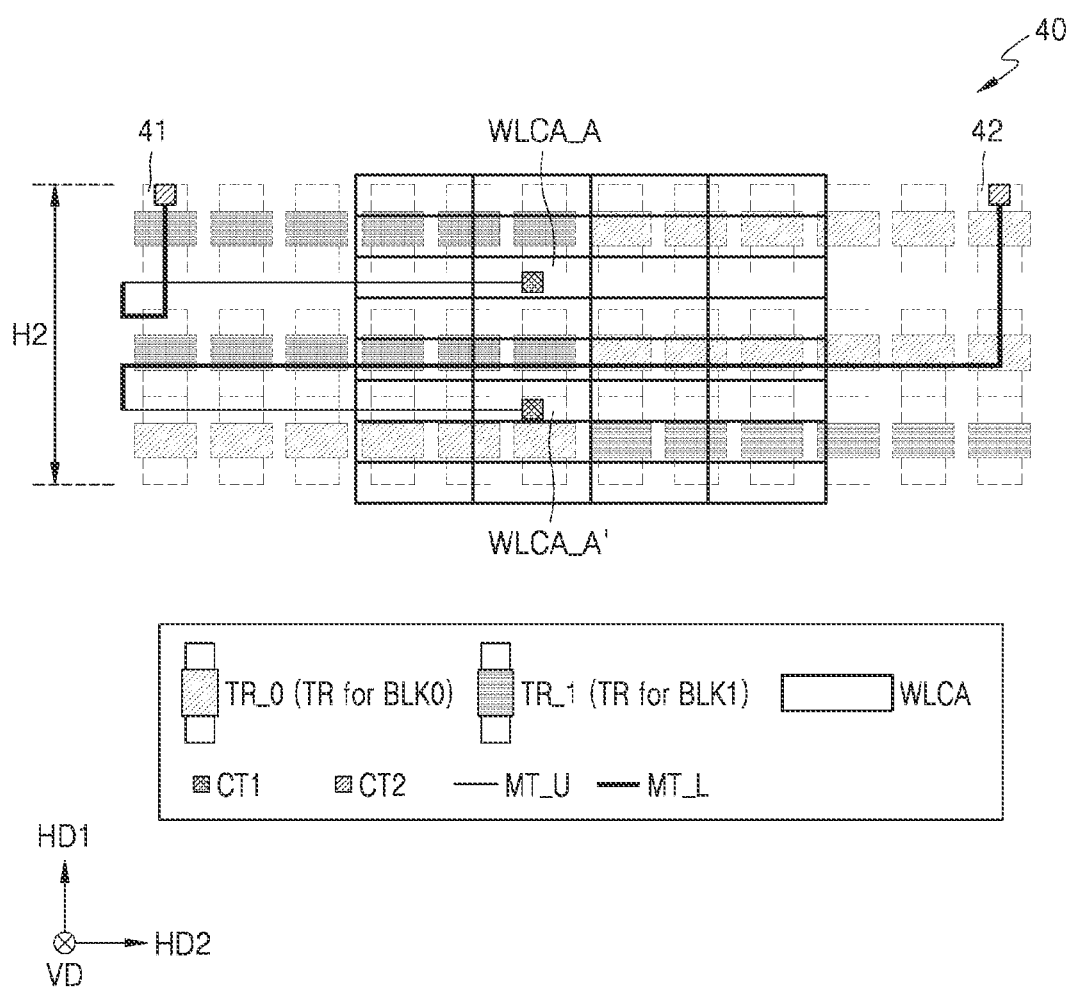

FIG. 20B illustrates an example of wiring between a pass transistor and a word line contact according to a comparative example for certain embodiments of the inventive concept.

Referring to FIGS. 2, 4, and 20B, in a comparative memory device 40, for example, the word line contact area WLCA_A may correspond to a contact area of the word line (e.g., WL18) of the second memory block BLK1, and the word line contact area WLCA_A' may correspond to a contact area of the word line (e.g., WL18) of the first memory block BLK0. For example, the pass transistor 41 may be connected to a word line (e.g., WL18) of the second memory block BLK1, and the pass transistor 42 may be connected to a word line (e.g., WL18) of the first memory block BLK0.

The word line contact area WLCA_A may be connected to the pass transistor 41 through the contact plug CT1, the upper metal layer MT_U, the lower metal layer MT_L, and the contact plug CT2, and the first length of the wiring connecting the word line contact area WACA_A to the pass transistor 41 may correspond to the sum of the lengths of the upper metal layer MT_U and the lower metal layer MT_L. Meanwhile, the word line contact area WLCA_A' may also be connected to the pass transistor 42 through the contact plug CT1, the upper metal layer MT_U, the lower metal layer MT_L, and the contact plug CT2, and the second length of the wiring connecting the word line contact area WACA_A' to the pass transistor 42 may correspond to the sum of the lengths of the upper metal layer MT_U and the lower metal layer MT_L.

Comparing the embodiments of FIG. 20A and FIG. 20A, a difference between the first length and the second length is notable. Accordingly, pass resistances of the word line (e.g., WL18) of the first memory block BLK0 and the word line (e.g., WL18) of the second memory block BLK1 may be significantly different, and as a result, loading time skews between word lines may occur. However, according to embodiments of the inventive concept, like those variously illustrated in FIGS. 1 to 20A, since the pass resistance of the word lines of the same level as each other is substantially the same, it is possible to reduce or eliminate loading time skews between the word lines of the same level.

Figure 21:
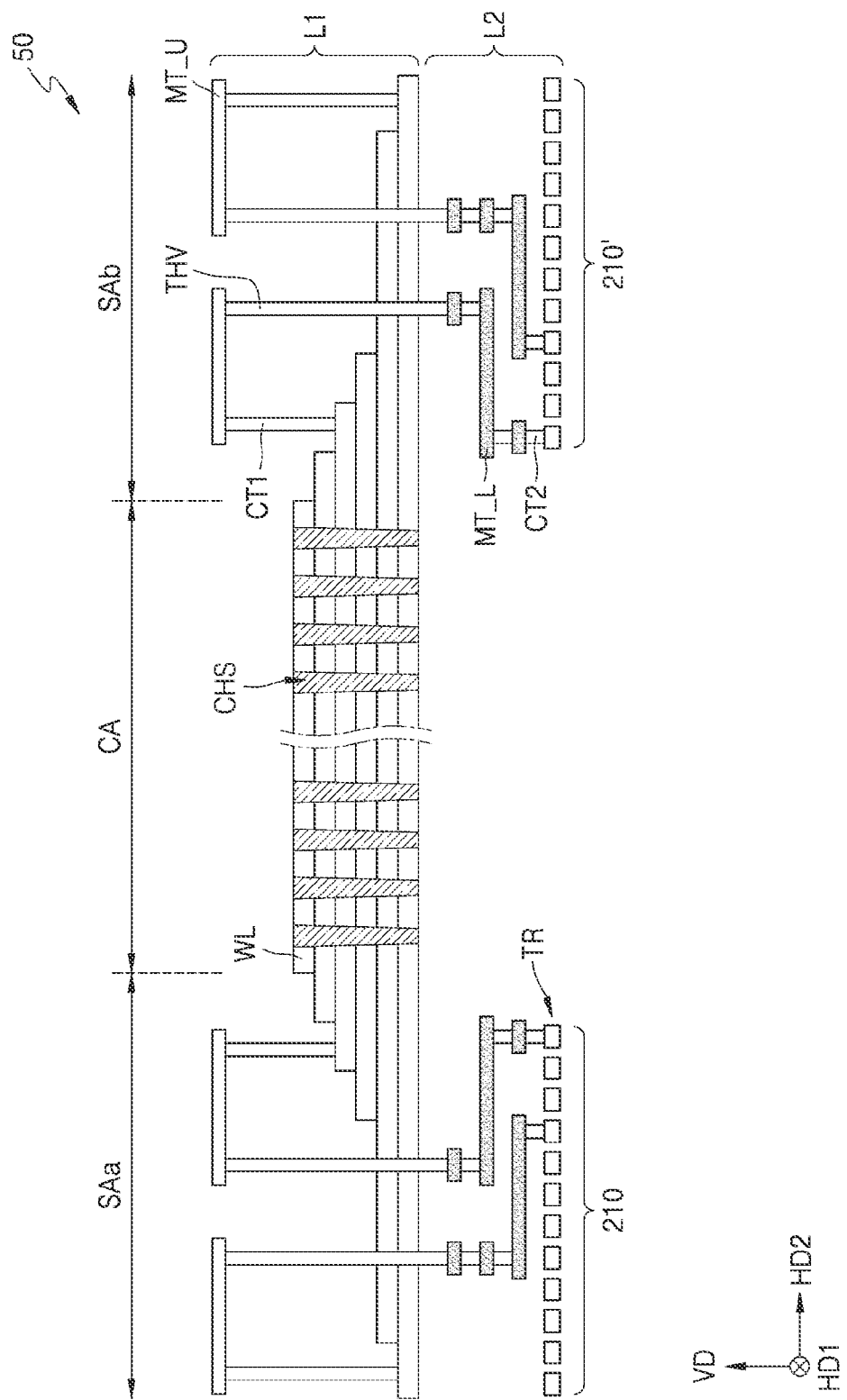
FIGS. 21, 22, 23 and 24 are respective cross-sectional views illustrating memory device(s) according to embodiments of the inventive concept.

FIG. 21 is a cross-sectional view illustrating a memory device 50 according to embodiments of the inventive concept.

Referring to FIG. 21, the memory device 50 includes a first semiconductor layer L1 and a second semiconductor layer L2, and may be formed in a COP structure. The first semiconductor layer L1 may include a cell area CA and first and second stair-stepped areas SAa and SAb. A plurality of channel structures CHS may be formed in the cell area CA. Word line contact areas may be formed in the first and second stair-stepped areas SAa and SAb, and a contact plug CT1 may be disposed in each word line contact area. The contact plug CT1 may be connected to the through electrode THV through the upper metal layer MT_U, and the through electrode THV may penetrate the plurality of word lines WL.

Pass transistor circuits 210 and 210' each including a plurality of pass transistors TR may be disposed on the second semiconductor layer L2. Specifically, in the second semiconductor layer L2, a pass transistor circuit 210 may be disposed in an area corresponding to the first stair-stepped area SAa, and a pass transistor circuit 210' may be disposed in an area corresponding to the second stair-stepped area SAb.

Figure 22:
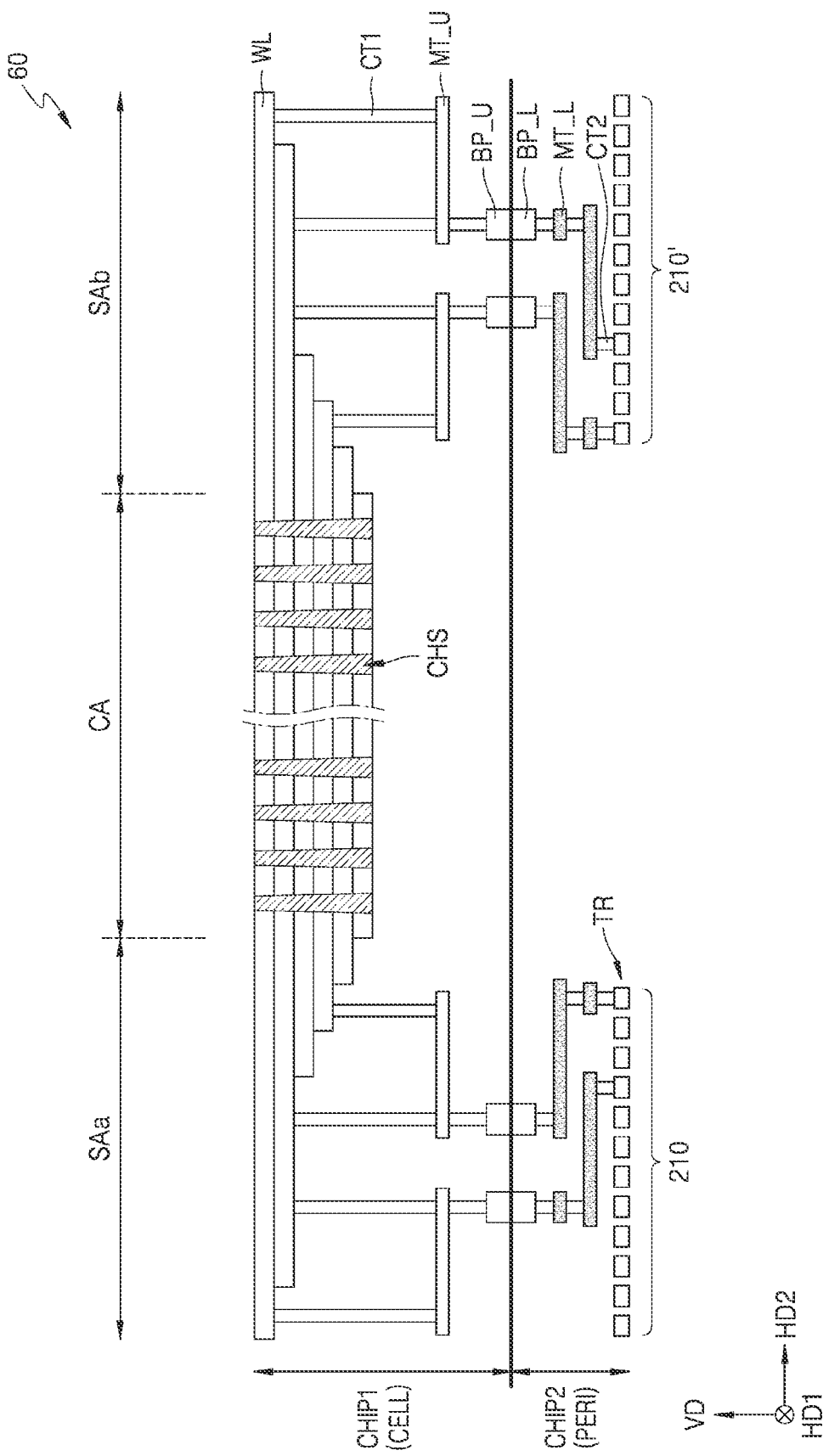

FIG. 22 is a cross-sectional view illustrating a memory device 60 according to embodiments of the inventive concept.

Referring to FIG. 22, the memory device 60 includes a first chip CHIP1 and a second chip CHIP2, and may be formed in a chip to chip (C2C) structure. Here, the C2C structure may mean that after fabricating an upper chip including a cell area CA on the first wafer, that is, a first chip CHIP1 and fabricating a lower chip including the peripheral circuit area PERI, that is, a second chip CHIP2 on a second wafer different from the first wafer, the first chip CHIP1 and the second chip CHIP2 are connected to each other by a bonding method. For example, the bonding method may refer to a method of electrically connecting the bonding metal formed on the uppermost metal layer of the first chip CHIP1 and the bonding metal formed on the uppermost metal layer of the second chip CHIP2. For example, when the bonding metal is formed of copper (Cu), the bonding method may be a Cu—Cu bonding method, and the bonding metal may also be formed of aluminum or tungsten.

The first chip (CHIP1) may include a cell area CA and first and second stair-stepped areas SAa and SAb. Channel structures CHS may be formed in the cell area CA. Word line contact areas may be formed in the first and second stair-stepped areas SAa and SAb, and a contact plug CT1 may be disposed in each word line contact area. The contact plug CT1 may be connected to the upper bonding pad BP_U through the upper metal layer MT_U. Pass transistor circuits 210 and 210' each including pass transistors TR may be disposed on the second chip (CHIP2). That is, in the second semiconductor layer L2, a pass transistor circuit 210 may be disposed in an area corresponding to the first stair-stepped area SAa, and a pass transistor circuit 210' may be disposed in an area corresponding to the second stair-stepped area SAb. A contact plug CT2 may be disposed on the source/drain area of the pass transistor TR, and may be connected to the lower bonding pad BP_L through the lower metal layer MU_L. The word line contact area may be electrically connected to the pass transistor TR through the connection between the upper bonding pad BP_U and the lower bonding pad BP_L.

Figure 23:
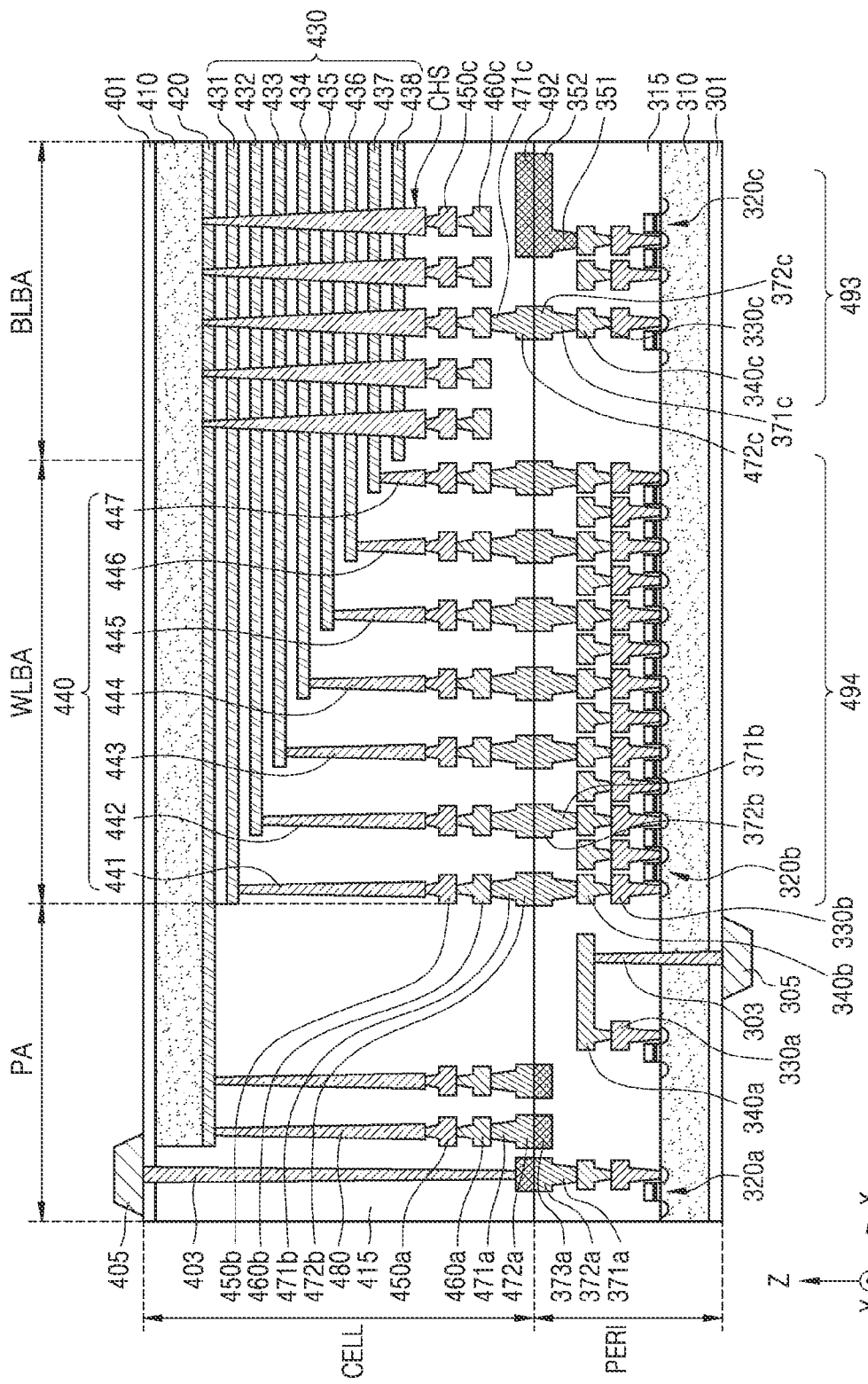

FIG. 23 is a cross-sectional view illustrating a memory device 500 according to embodiments of the inventive concept.

Referring to FIG. 23, the memory device 500 may have a C2C structure. The embodiments illustrated in FIGS. 1 to 22 may be implemented similar to the memory device 500. That is, the pass transistor circuit described above with reference to FIGS. 1 to 22 may be disposed in the peripheral circuit area (PERI). Each of the peripheral circuit area and the cell area (CELL) of the memory device 500 may include an external pad bonding area PA, a word line bonding area WLBA, and a bit line bonding area BLBA. The peripheral circuit area may include a first substrate 310, an interlayer insulating layer 315, circuit elements 320a, 320b, and 320c formed on the first substrate 310, first metal layers 330a, 330b, and 330c respectively connected to the circuit elements 320a, 320b, and 320c, and second metal layers 340a, 340b, 340c formed on the first metal layers 330a, 330b, 330c. In some embodiments, the first metal layers 330a, 330b, and 330c may be formed of tungsten having a relatively high resistance, and the second metal layers 340a, 340b and 340c may be formed of copper having a relatively low resistance.

Here, only the first metal layers 330a, 330b, and 330c and the second metal layers 340a, 340b, and 340c are shown and described, but the inventive concept is not limited thereto, and at least one metal layer may be further formed on the second metal layers 340a, 340b, and 340c. At least some of the one or more metal layers formed on the second metal layers 340a, 340b, and 340c may be formed of aluminum or the like having a lower resistance than copper forming the second metal layers 340a, 340b, and 340c.

The interlayer insulating layer 315 may be disposed on the first substrate 310 to cover the plurality of circuit elements 320a, 320b, and 320c, the first metal layers 330a, 330b, and 330c, and the second metal layers 340a, 340b, and 340c, and may include an insulating material such as silicon oxide, silicon nitride, or the like.

Lower bonding metals 371b and 372b may be formed on the second metal layer 340b in the word line bonding area WLBA. In the word line bonding area WLBA, the lower bonding metals 371b and 372b of the peripheral circuit area may be electrically connected to each other by a bonding method with the upper bonding metals 471b and 472b of the cell area, and the lower bonding metals 371b and 372b and the upper bonding metals 471b and 472b may be formed of aluminum, copper, or tungsten. The upper bonding metals 471b and 472b of the cell area may be referred to as first metal pads, and the lower bonding metals 371b and 372b of the peripheral circuit area may be referred to as second metal pads.

The cell area may provide at least one memory block. The cell area may include a second substrate 410 and a common source line 420. On the second substrate 410, word lines 431 to 438 (i.e., 430) may be stacked along a direction VD perpendicular to the upper surface of the second substrate 410. String selection lines and ground selection lines may be disposed on each of the upper and lower portions of the word lines 430, and the word lines 430 may be disposed between the string selection lines and the ground selection line.

In the bit line bonding area BLBA, the channel structure CHS may extend in a direction perpendicular to the upper surface of the second substrate 410 to pass through the word lines 430, the string selection lines, and the ground selection lines. The channel structure CHS may include a data storage layer, a channel layer, and a buried insulating layer, and the channel layer may be electrically connected to the first metal layer 450c and the second metal layer 460c. For example, the first metal layer 450c may be a bit line contact, and the second metal layer 460c may be a bit line. In an embodiment, the bit line 460c may extend in a first horizontal direction HD1 parallel to the upper surface of the second substrate 410.

In the embodiment illustrated in FIG. 23, an area where the channel structure CHS and the bit line 460c are disposed may be defined as the bit line bonding area BLBA. The bit line 460c may be electrically connected to the circuit elements 320c providing the page buffer 493 in the peripheral circuit area in the bit line bonding area BLBA. As an example, the bit line 460c is connected to the upper bonding metals 471c and 472c in the peripheral circuit area, and the upper bonding metals 471c and 472c may be connected to the lower bonding metals 371c and 372c connected to the circuit elements 320c of the page buffer 493.

In the word line bonding area WLBA, the word lines 430 may extend along a second horizontal direction HD2 parallel to the upper surface of the second substrate 410, and may be connected to a plurality of cell contact plugs 441 to 447 (i.e., 440). The word lines 430 and the cell contact plugs 440 may be connected to each other by pads provided by extending at least some of the word lines 430 to different lengths along the second horizontal direction. The first metal layer 450b and the second metal layer 460b may be sequentially connected to the upper portions of the cell contact plugs 440 connected to the word lines 430. The cell contact plugs 440 may be connected to the peripheral circuit area through the upper bonding metals 471b and 472b of the cell area and the lower bonding metals 371b and 372b of the peripheral circuit area in the word line bonding area WLBA.

The cell contact plugs 440 may be electrically connected to the circuit elements 320b providing the row decoder 494 in the peripheral circuit area PERI. In an embodiment, operating voltages of the circuit elements 320b providing the row decoder 494 may be different from the operating voltages of the circuit elements 320c providing the page buffer 493. For example, the operating voltages of the circuit elements 320c providing the page buffer 493 may be greater than the operating voltages of the circuit elements 320b providing the row decoder 494.

A common source line contact plug 480 may be disposed in the outer pad bonding area PA. The common source line contact plug 480 is formed of a conductive material such as a metal, a metal compound, or polysilicon, and may be electrically connected to the common source line 420. A first metal layer 450a and a second metal layer 460a may be sequentially stacked on the common source line contact plug 480. For example, an area where the common source line contact plug 480, the first metal layer 450a, and the second metal layer 460a are disposed may be defined as an outer pad bonding area PA.

Further, I/O pads 305 and 405 may be disposed in the outer pad bonding area PA. Referring to FIG. 23, a lower insulating layer 301 covering a lower surface of the first substrate 310 may be formed under the first substrate 310, and a first I/O pad 305 may be formed on the lower insulating layer 301. The first I/O pad 305 may be connected to at least one of the plurality of circuit elements 320a, 320b, and 320c disposed in the peripheral circuit area through the first I/O contact plug 303, and may be separated from the first substrate 310 by the lower insulating layer 301. In addition, a side insulating layer may be disposed between the first I/O contact plug 303 and the first substrate 310 to electrically separate the first I/O contact plug 303 from the first substrate 310.

Referring to FIG. 23, an upper insulating layer 401 covering an upper surface of the second substrate 410 may be formed on the second substrate 410, and a second I/O pad 405 may be disposed on the upper insulating layer 401. The second I/O pad 405 may be connected to at least one of the plurality of circuit elements 320a, 320b, and 320c disposed in the peripheral circuit area PERI through the second I/O contact plug 403.

According to embodiments, the second substrate 410 and the common source line 420 may not be disposed in an area where the second I/O contact plug 403 is disposed. Also, the second I/O pad 405 may not overlap with the word lines 430 in the vertical direction (e.g., the Z-axis direction). Referring to FIG. 23, the second I/O contact plug 403 may be separated from the second substrate 410 in a direction parallel to the upper surface of the second substrate 410, and may pass through the interlayer insulating layer 415 of the cell area to be connected to the second I/O pad 405.

In some embodiments, the first I/O pad 305 and the second I/O pad 405 may be selectively formed. For example, the memory device 400 may include only the first I/O pad 305 disposed on the first substrate 310, or may include only the second I/O pad 405 disposed on the second substrate 410. Alternatively, the memory device 400 may include both the first I/O pad 305 and the second I/O pad 405.

In each of the outer pad bonding area PA and the bit line bonding area BLBA respectively included in the cell area and the peripheral circuit area, the metal pattern of the uppermost metal layer may exist as a dummy pattern, or the uppermost metal layer may be empty.

In relation to the memory device 400, a lower metal pattern 373a having the same shape as the upper metal pattern 472a of the cell area may be formed on the uppermost metal layer of the peripheral circuit area in correspondence to the upper metal pattern 472a formed on the uppermost metal layer of the cell area in the outer pad bonding area PA. The lower metal pattern 373a formed on the uppermost metal layer of the peripheral circuit area may not be connected to a separate contact in the peripheral circuit area. Similarly, in correspondence to the lower metal pattern formed on the uppermost metal layer of the peripheral circuit area in the outer pad bonding area PA, an upper metal pattern having the same shape as the lower metal pattern of the peripheral circuit area may be formed on the upper metal layer of the cell area.

Lower bonding metals 371b and 372b may be formed on the second metal layer 340b in the word line bonding area WLBA. In the word line bonding area WLBA, the lower bonding metals 371b and 372b of the peripheral circuit area may be electrically connected to each other through a bonding method with the upper bonding metals 471b and 472b of the cell area.

Also, in the bit line bonding area BLBA, in correspondence to the lower metal pattern 352 formed on the uppermost metal layer of the peripheral circuit area, an upper metal pattern 492 having the same shape as the lower metal pattern 352 of the peripheral circuit area may be formed on the uppermost metal layer of the cell area. A contact may not be formed on the upper metal pattern 492 formed on the uppermost metal layer of the cell area.

Figure 24:
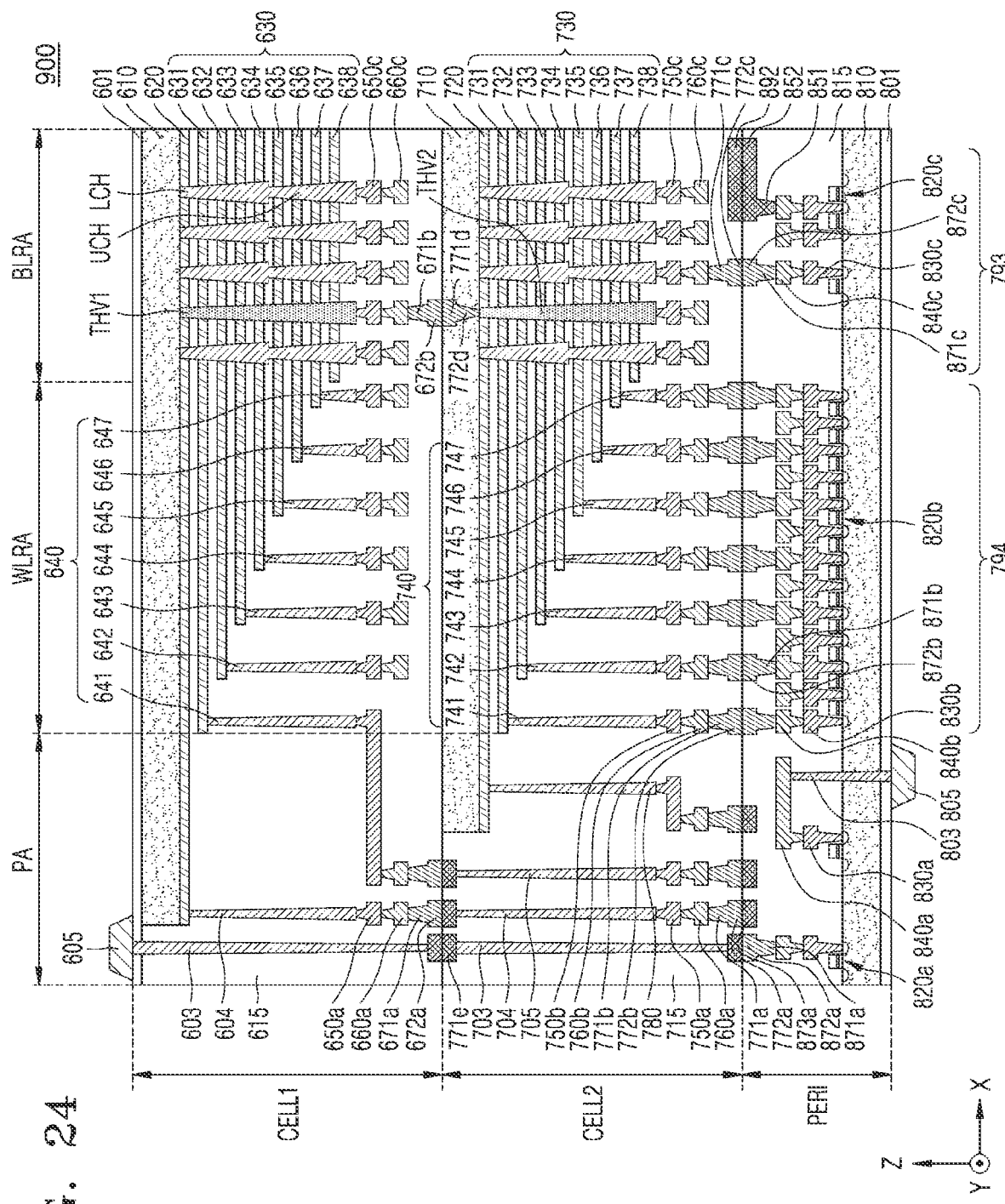

FIG. 24 is a cross-sectional view illustrating a memory device 900 according to embodiments of the inventive concept.

Referring to FIG. 24, in contrast to the memory device 500 of FIG. 23, the memory device 900 may include two or more upper chips om the cell area. That is, the memory device 900 may have a structure in which the first upper chip including the first cell area (CELL1), the second upper chip including the second cell area (CELL2), and the lower chip including the peripheral circuit area (PERI) are connected by a bonding method. However, the number of upper chips is not limited thereto. Among the descriptions of the first cell area, the second cell area, and the peripheral circuit area, portions previous provided in relation to FIG. 23 will be omitted. Hereinafter, the cell area may refer to at least one of the first cell area and/or the second cell area.

The cell area may include a lower channel LCH and an upper channel UCH connected to each other in the bit line bonding area BLBA. The lower channel LCH and the upper channel UCH may be connected to each other to form one channel structure CHS. That is, in contrast to the channel structure CHS of FIG. 23, the channel structure CHS of FIG.

24 may be formed through a process for the lower channel LCH and a process for the upper channel UCH. In the first cell area CELL, the lower channel LCH extends in a direction perpendicular to the upper surface of the third substrate 610 to pass through the common source line 620 and the lower word lines 631 to 634. The lower channel LCH may include a data storage layer, a channel layer, and a buried insulating layer, and may be connected to the upper channel UCH. The upper channel UCH may pass through the upper word lines 635 to 638. The upper channel UCH may include a data storage layer, a channel layer, and a buried insulating layer, and the channel layer of the upper channel UCH may be electrically connected to the first metal layer 650c and the second metal layer 660c. As the length of the channel increases, it may be difficult to form a channel having a constant width due to process reasons. The memory device 900 according to embodiments of the inventive concept may include a channel having improved width uniformity through the lower channel LCH and the upper channel UCH formed through a sequential process.

As described above, a string selection line and a ground selection line may be disposed above and below the word lines 630 and 730, respectively. In some embodiments, a word line adjacent to a string selection line or a word line adjacent to a ground selection line may be a dummy word line. Further, in the memory device 900 of FIG. 24, a word line positioned near a boundary between the lower channel LCH and the upper channel UCH may be a dummy word line. For example, the word line 634 and the word line 635 forming a boundary between the lower channel LCH and the upper channel UCH may be dummy word lines.

In the bit line bonding area BLBA, the first cell area may include a first through electrode THV1, and the second cell area may include a second through electrode THV2. The first through electrode THV1 may pass through the common source line 620 and the plurality of word lines 630. The first through electrode THV1 may further penetrate the third substrate 610. The first through electrode THV1 may include a conductive material. Alternatively, the first through electrode THV1 may include a conductive material surrounded by an insulating material. The second through electrode THV2 may also be the same as the first through electrode THV1. The first through electrode THV1 and the second through electrode THV2 may be electrically connected through the first through upper metal pattern 672b and the second through lower metal pattern 771d. The first through upper metal pattern 672b may be formed at an upper end of the first upper chip including the first cell area, and the second through lower metal pattern 771d may be formed at a lower end of the second upper chip including the second cell area. The first through electrode THV1 may be electrically connected to the first metal layer 650c and the second metal layer 660c. A first through via 671b may be formed between the second metal layer 660c and the first through upper metal pattern 672b, and a second through via 772d may be formed between the second through electrode THV2 and the second through lower metal pattern 771d. The first through upper metal pattern 672b and the second through lower metal pattern 771d may be connected by a bonding method.

In some embodiments, a first upper metal pattern 672a may be formed on an upper end of the first cell area, and a first lower metal pattern 771e may be formed on a lower end of the second cell area. The first upper metal pattern 672a of the first cell area and the first lower metal pattern 771e of the second cell area may be connected in the outer pad bonding area PA by a bonding method. Further, a second upper metal pattern 772a may be formed at an upper end of the second cell area and a second lower metal pattern 873a may be formed at a lower end of the peripheral circuit area PERI. The second upper metal pattern 772a of the second cell area and the second lower metal pattern 873a of the peripheral circuit area may be connected in the outer pad bonding area PA by a bonding method.

Figure 25:
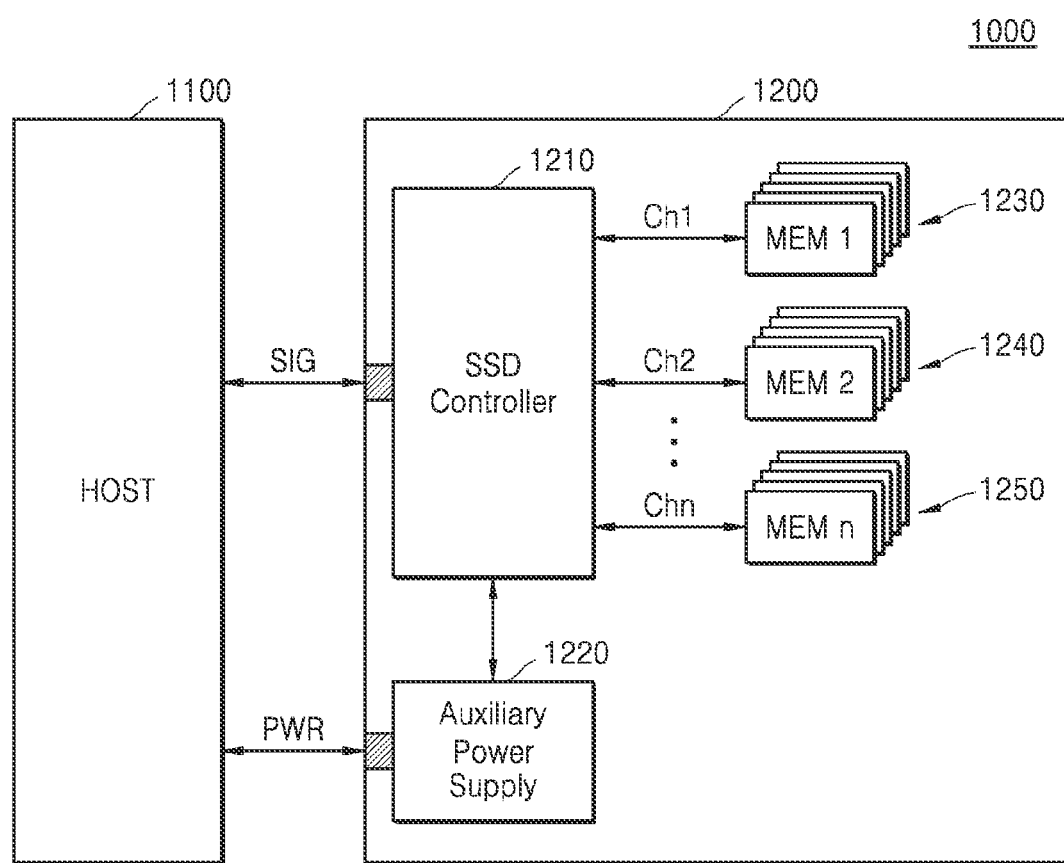
FIG. 25 is a block diagram illustrating a memory device according to embodiments of the inventive device, as applied to an SSD system.

FIG. 25 is a block diagram illustrating a memory device according to embodiments of the inventive concept, as applied to an SSD system 1000.

Referring to FIG. 25, the SSD system 1000 may include a host 1100 and an SSD 1200. The SSD 1200 exchanges signals with the host 1100 through a signal connector, and receives power through a power connector. The SSD 1200 may include an SSD controller 1210, an auxiliary power supply device 1220, and memory devices 1230, 1240, and 1250. The memory devices 1230, 1240, and 1250 may be vertically stacked NAND flash memory devices. In this case, the SSD 1200 may be implemented using the embodiments described above with reference to FIGS. 1 to 20A and 21 to 24.

While the inventive concept has been particularly shown and described with reference to embodiments thereof, it will be understood that various changes in form and details may be made therein without departing from the spirit and scope of the following claims.

What is claimed is:

1. A memory device comprising:
a first chip including a first memory block, a second memory block, and a first bonding pad; and
a second chip including first pass transistors electrically connected to the first memory block, second pass transistors electrically connected to the second memory block, and a second bonding pad, and vertically connected to the first chip by the first and second bonding pads,
wherein the first and second pass transistors are divided into an odd number of pass transistor groups,
wherein the odd number of pass transistor groups includes:
a first pass transistor group including some of the first pass transistors electrically connected to the first memory block;
a second pass transistor group including some of the second pass transistors electrically connected to the second memory block; and
a third pass transistor group including the remaining of the first pass transistors electrically connected to the first memory block and the remaining of the second pass transistors electrically connected to the second memory block, and
wherein the first and second pass transistor groups are adjacently disposed in a first direction, and the second and the third pass transistor groups are adjacently disposed in the first direction.

2. The memory device of claim 1, wherein the first pass transistors in the first pass transistor group are disposed in a second direction perpendicular to the first direction,
wherein the second pass transistors in the second pass transistor group are disposed in the second direction, and
wherein the first and second pass transistors in the third pass transistor group are disposed in the second direction.

3. The memory device of claim 1, wherein the second chip further includes third pass transistors electrically connected to the first memory block, and fourth pass transistors electrically connected to the second memory block,
wherein the odd number of pass transistor groups further includes:
a fourth pass transistor group including the third pass transistors; and
a fifth pass transistor group including the fourth pass transistors.

4. The memory device of claim 3, wherein the first to fifth pass transistor groups are disposed in the first direction.

5. The memory device of claim 4, wherein a size of the first to fifth pass transistor groups in the first direction is the same as a size of the first and second memory blocks in the first direction.

6. The memory device of claim 4, wherein the third pass transistors in the fourth pass transistor group are disposed in a second direction perpendicular to the first direction, and
wherein the fourth pass transistors in the fifth pass transistor group are disposed in the second direction.

7. The memory device of claim 1, wherein the second chip further includes a first driving signal line and a second driving signal line,
wherein one of the first pass transistors electrically connected to the first memory block is connected between a selected word line and the first driving signal line, and
wherein one of the second pass transistors electrically connected to the second memory block is connected between an unselected word line and the second driving signal line.

8. The memory device of claim 7, wherein during a program operation, a program voltage is applied to the first driving signal line, and a pass voltage is applied to the second driving signal line,
wherein during a read operation, a read voltage is applied to the first driving signal line, and a read pass voltage is applied to the second driving signal line, and
wherein during an erase operation, an erase voltage is applied to both the first driving signal line and the second driving signal line.

9. The memory device of claim 1, wherein a size of the first to third pass transistor groups in the first direction is the same as a size of the first and second memory blocks in the first direction.

10. The memory device of claim 1, wherein one of the first pass transistors which is disposed in the third pass transistor group and connected to a first word line of the first memory block is adjacent to one of the second pass transistors which is disposed in the third pass transistor group and connected to a first word line of the second memory block, and
wherein the first word line of the first memory block and the first word line of the second memory block are disposed at a same level.

11. A memory device comprising:
a first chip including a first memory block, a second memory block, and a first bonding pad; and
a second chip including first pass transistors electrically connected to the first memory block, second pass transistors electrically connected to the second memory block, and a second bonding pad, and vertically connected to the first chip by the first and second bonding pads,
wherein the first and second pass transistors are divided into a first plurality of pass transistor groups,
wherein the first plurality of pass transistor groups includes:
a first pass transistor group including some of the first pass transistors electrically connected to the first memory block;
a second pass transistor group including some of the second pass transistors electrically connected to the second memory block; and
a third pass transistor group including the remaining of the first pass transistors electrically connected to the first memory block and the remaining of the second pass transistors electrically connected to the second memory block, and
wherein the first to third pass transistor groups are adjacently disposed in a first direction.

12. The memory device of claim 11, wherein the first pass transistors in the first pass transistor group are disposed in a second direction perpendicular to the first direction,
wherein the second pass transistors in the second pass transistor group are disposed in the second direction, and wherein the first and second transistors in the third pass transistor group are disposed in the second direction.

13. The memory device of claim 11, wherein the first chip further includes a third memory block and a fourth memory block,
wherein the second chip further includes third pass transistors electrically connected to the third memory block, and fourth pass transistors electrically connected to the fourth memory block,
wherein the third and fourth pass transistors are divided into a second plurality of pass transistor groups, and
wherein the second plurality of pass transistor groups includes:
a fourth pass transistor group including some of the third pass transistors electrically connected to the third memory block;
a fifth pass transistor group including some of the fourth pass transistors electrically connected to the fourth memory block; and
a sixth pass transistor group including the remaining of the third pass transistors electrically connected to the third memory block and the remaining of the fourth pass transistors electrically connected to the fourth memory block.

14. The memory device of claim 13, wherein the fourth to sixth pass transistor groups are adjacently disposed in the first direction.

15. The memory device of claim 14, wherein a size of the first to sixth pass transistor groups in the first direction is the same as a size of the first to fourth memory blocks in the first direction.

16. The memory device of claim 14, wherein the third pass transistors in the fourth pass transistor group are disposed in a second direction perpendicular to the first direction,
wherein the fourth pass transistors in the fifth pass transistor group are disposed in the second direction, and
wherein the third and fourth pass transistors in the sixth pass transistor group are disposed in the second direction.

17. The memory device of claim 11, wherein the second chip further includes a first driving signal line and a second driving signal line,
wherein one of the first pass transistors electrically connected to the first memory block is connected between a selected word line and the first driving signal line, and wherein one of the second pass transistors electrically connected to the second memory block is connected between an unselected word line and the second driving signal line.

18. The memory device of claim 17, wherein during a program operation, a program voltage is applied to the first driving signal line, and a pass voltage is applied to the second driving signal line,
    wherein during a read operation, a read voltage is applied to the first driving signal line, and a read pass voltage is applied to the second driving signal line, and
    wherein during an erase operation, an erase voltage is applied to both the first driving signal line and the second driving signal line.

19. The memory device of claim 11, wherein one of the first pass transistors which is disposed in the third pass transistor group and connected to a first word line of the first memory block is adjacent to one of the second pass transistors which is disposed in the third pass transistor group and connected to a first word line of the second memory block,
    wherein the first word line of the first memory block and the first word line of the second memory block are disposed at a same level.

20. The memory device of claim 11, wherein a size of the first to third pass transistor groups in the first direction is the same as a size of the first and second memory blocks in the first direction.

21. A memory device comprising:
    a first memory chip;
    a second memory chip vertically connected to the first memory chip; and
    a peripheral chip vertically connected to the second memory chip,
    wherein the peripheral chip includes a first pass transistor group, a second pass transistor group and a third pass transistor group disposed in a first direction,
    wherein the first pass transistor group includes first pass transistors electrically connected to a first memory block and disposed in a second direction perpendicular to the first direction,
    the second pass transistor group includes second pass transistors electrically connected to a second memory block and disposed in the second direction, and
    the third pass transistor group includes third pass transistors electrically connected to the first memory block, and fourth pass transistors electrically connected to the second memory block, the third and fourth pass transistors being disposed in the second direction, and
    wherein the first and second memory blocks are included in the first memory chip or the second memory chip.

22. The memory device of claim 21, wherein the peripheral chip further includes a fourth pass transistor group and a fifth pass transistor group,
    wherein the fourth pass transistor group includes fifth pass transistors electrically connected to the first memory block, and the fifth pass transistor group includes sixth pass transistors electrically connected to the second memory block.

23. The memory device of claim 22, wherein the first to fifth pass transistor groups are disposed in the first direction.

24. The memory device of claim 23, wherein a size of the first to fifth pass transistor groups in the first direction is the same as a size of the first and second memory blocks in the first direction.

25. The memory device of claim 23, wherein the fifth pass transistors in the fourth pass transistor group are disposed in the second direction, and
    wherein the sixth pass transistors in the fifth pass transistor group are disposed in the second direction.

26. The memory device of claim 21, wherein the peripheral chip further includes a first driving signal line and a second driving signal line,
    wherein one of the first pass transistors electrically connected to the first memory block is connected between a selected word line and the first driving signal line, and
    wherein one of the second pass transistors electrically connected to the second memory block is connected between an unselected word line and the second driving signal line.

27. The memory device of claim 26, wherein during a program operation, a program voltage is applied to the first driving signal line, and a pass voltage is applied to the second driving signal line,
    wherein during a read operation, a read voltage is applied to the first driving signal line, and a read pass voltage is applied to the second driving signal line, and
    wherein during an erase operation, an erase voltage is applied to both the first driving signal line and the second driving signal line.

28. The memory device of claim 21, wherein a size of the first to third pass transistor groups in the first direction is the same as a size of the first and second memory blocks in the first direction.

29. The memory device of claim 21, wherein one of the third pass transistors electrically connected to the first memory block which is connected to a first word line of the first memory block is adjacent to one of the fourth pass transistors electrically connected to the second memory block which is connected to a first word line of the second memory block, and
    wherein the first word line of the first memory block and the first word line of the second memory block are disposed at a same level.

* * * * *